United States Patent [19]
Tazunoki et al.

[11] Patent Number: 5,410,507
[45] Date of Patent: Apr. 25, 1995

[54] SPECIAL MODE CONTROL METHOD FOR DYNAMIC RANDOM ACCESS MEMORY

[75] Inventors: Masanori Tazunoki, Hamura; Shigetoshi Sakomura, Ohme; Toshitsugu Takekuma; Yutaka Ito, both of Ohme; Kazuya Ito, Hamura; Wataru Arakawa, Ohme; Hidetoshi Iwai, Ohme; Toshiyuki Sakuta, Ohme; Masamichi Ishihara, Hamura, all of Japan

[73] Assignee: Hitachi, Ltd., Tokyo, Japan

[21] Appl. No.: 977,212

[22] Filed: Nov. 16, 1992

[30] Foreign Application Priority Data

Nov. 15, 1991 [JP] Japan .................................. 3-327032
Nov. 15, 1991 [JP] Japan .................................. 3-327033

[51] Int. Cl.⁶ .............................................. G11C 13/00
[52] U.S. Cl. ............................ 365/189.09; 365/189.05
[58] Field of Search ...................... 365/189.09, 189.05, 365/227, 222

[56] References Cited

U.S. PATENT DOCUMENTS 5,172,341 12/1992 Amin ................................ 365/233 X

OTHER PUBLICATIONS

"Technical Bulletin ED-90-78 of Institute of Electronics and Communication Engineers of Japan".

*Primary Examiner*—Do Hyun Yoo
*Attorney, Agent, or Firm*—Antonelli, Terry, Stout & Kraus

[57] ABSTRACT

A dynamic RAM provided with a data retention mode intended for low power consumption is provided. In the data retention mode, the current supply capabilities of voltage generation circuits which generate decreased voltage, increased voltage, reference voltage, etc., are limited in the range in which information retention operation in memory cells can be maintained, and the number of selected memory mats in the data retention mode is increased with respect to that of memory mats selected in the normal read/write mode and refresh mode. Special modes such as the data retention mode are set by combining an address strobe signal and other control signals and dummy CBR refresh is executed to release the special mode.

50 Claims, 16 Drawing Sheets

DRAM OPERATION MODE

SPECIAL MODE CONTROL METHOD FOR DYNAMIC RANDOM ACCESS MEMORY

BACKGROUND OF THE INVENTION

This invention relates to a dynamic RAM (random access memory) and a special mode control method therefor, and more particularly to effective technologies used for dynamic RAM provided with a low power consumption mode intended only for information retention operation.

The dynamic RAM operation modes include normal write/read, test, and refresh modes. To lower power consumption of a memory system with dynamic RAM, low power consumption modes such as a battery backup mode have been proposed; such a battery backup mode is reported, for example, on Technical Bulletin ED-90-78 of Institute of Electronics and Communication Engineers of Japan. The battery backup mode is set by fixing CASB signal low and RASB signal high over 16 ms or more after automatic refresh is started with the CBR (CASB before RASB) mode.

SUMMARY OF THE INVENTION

It became apparent from examination of the inventor that the above-mentioned mode setting method requires setting the automatic refresh mode by the CBR mode once before fixing the CASB signal low and RASB signal high over 16 ms or more, making the setting method cumbersome and that there is a chance that stored information in memory cells will be lost depending on the accuracy of the timer for measuring the time 16 ms. It also became apparent from examination of the inventor that although the mode is released by resetting the CASB signal, internal circuitry operates in a different way from the normal operation mode for low power consumption of dynamic RAM, thus if write/read operation is performed immediately after the mode is released, there is a chance that the internal circuitry will become unstable and malfunction.

It is one object of the invention to provide a special mode control method for dynamic RAM containing a low power consumption mode to enable efficient, stable, and secure operation.

It is another object of the invention to provide dynamic RAM having a data retention mode intended for low power consumption for the purpose of information retention operation only.

These and other objects and novel features of the invention will become more fully apparent upon a reading of the following detailed description taken in conjunction with the accompanying drawings.

One aspect of the invention is simply described as follows: By combining an address strobe signal and other control signals, a special mode is set and dummy CBR refresh is executed for releasing the mode.

According to the above-mentioned means, special modes containing a low power consumption mode which is efficient, secure, and stable can be set by combining timings of external clock containing an address strobe signal and the internal circuits can be restored to the normal state without destroying stored data by executing dummy CBR refresh to release the special mode.

Another aspect of the invention is simply described as follows: The current supply capabilities of voltage generation circuits which generate decreased voltage, increased voltage, reference voltage, etc., are limited in the range in which information retention operation in memory cells can be maintained, and/or the number of selected memory mats in the data retention mode is increased with respect to that of memory mats selected in the normal read/write mode and refresh mode.

According to the above-mentioned means, by limiting the current supply capabilities of the voltage generation circuits and increasing the number of selected mats, the number of times the peripheral circuitry operates can be substantially reduced, thus low power consumption is enabled.

DESCRIPTION OF THE PREFERRED EMBODIMENTS

Figure 1:
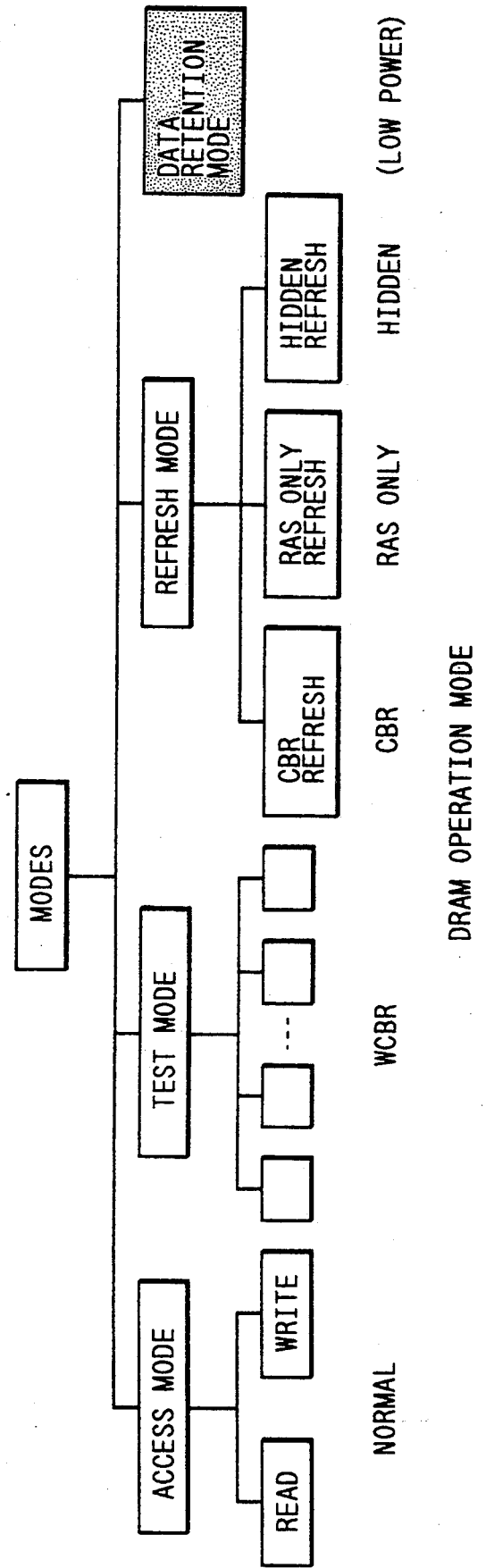
FIG. 1 is a functional block diagram showing one embodiment of dynamic RAM according to the invention.

FIG. 1 shows a functional block diagram of one embodiment in dynamic RAM (hereinafter simply referred to as DRAM) according to the invention.

The DRAM in this embodiment has an access mode consisting of read operation (READ) and write operation (WRITE). In this access mode, as with the known access method to DRAM, a row address signal is input in synchronization with row address strobe signal RASB and then a column address signal is input in synchronization with column address strobe signal CASB for selecting a specific memory cell address. For write operation, write enable signal WEB is set low; for read operation, write enable signal WEB is set high. An early write cycle is also available which is executed by setting the write enable signal WEB low before CASB. Bear in mind that the signals with a suffix B, such as RASB, CASB, and WEB, are active low in the specification.

A test mode is mainly used for an operation check at production and shipment of DRAM. The test mode is executed as the WCBR mode which sets write enable signal WEB and column address strobe signal CASB low before row address strobe signal RASB.

As known, DRAM uses memory cells each consisting of a metal oxide semiconductor field effect transistor (MOSFET) for address selection and a capacitor for information storage and retains information corresponding to logical 1 or 0 according to whether or not the information storage capacitor contains an information charge. As the time elapses, the information charges retained in the information storage capacitors are lost due to drain leakage current, etc., at the MOSFETs for address selection. Then, DRAM has a refresh mode which reads information before the storage charge of each memory cell is lost and amplifies it, then writes into the given memory cell. The three types of refresh mode are available: CBR refresh which sets column address strobe signal CASB low before row address strobe signal RASB; RAS only refresh executed by setting row address strobe signal RASB low; and hidden refresh in which the RASB signal is reset from the read state and with the read data remaining output, refresh is executed by the RASB. Among these refresh modes, the RAS only refresh function is not necessarily required as described below.

The DRAM of the embodiment is provided with a data retention mode as one of special modes other than the modes described above. This data retention mode is a low power consumption mode considered only for data retention operation in memory cells for reducing operation current as much as possible, as described below. Thus, the internal circuits regarded as unnecessary for data retention operation in the memory cells are deactivated, in other words, into which no operation current flows during refresh operation for data retention operation.

Figure 2:
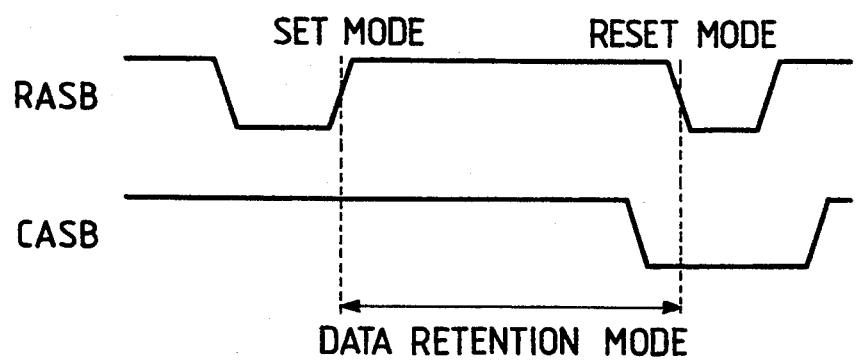
FIG. 2 is an operation timing chart showing one embodiment to set a data retention mode according to the invention.

FIG. 2 shows an operation timing chart of one embodiment to set the data retention mode. In this embodiment, the RAS only refresh function is deleted from the DRAM refresh mode. That is, RAS only refresh operation is to operate row internal circuits for refreshing the memory cells and for this purpose, requires inputting of address signals corresponding to word lines for refresh operation from the external, thus requires an external address generation circuit which generates refresh addresses. In contrast, in CBR refresh operation, addresses are internally generated, thus external circuitry can be simplified drastically. Therefore, the necessity for the RAS only refresh will be eliminated for the future.

Then, in the embodiment, the RAS only refresh function is deleted as described above, and as shown in FIG. 2, with the CASB signal fixed high the RASB signal is set low and then reset high, at the timing of which the data retention mode is entered. The data retention mode is reset or released by setting the CASB signal active low, then setting the RASB signal low. That is, in the embodiment, dummy refresh is executed at the same time as the data retention mode is released by CBR refresh. By inserting such dummy CBR refresh, circuit initialization is executed which is required for internal circuitry as described below to enter the normal mode from the data retention mode.

The embodiment enables extremely simple, steady, and secure setting and releasing of the data retention mode by combining the RASB and CASB signals and also provides a simple internal circuit for the purpose.

Figure 3:
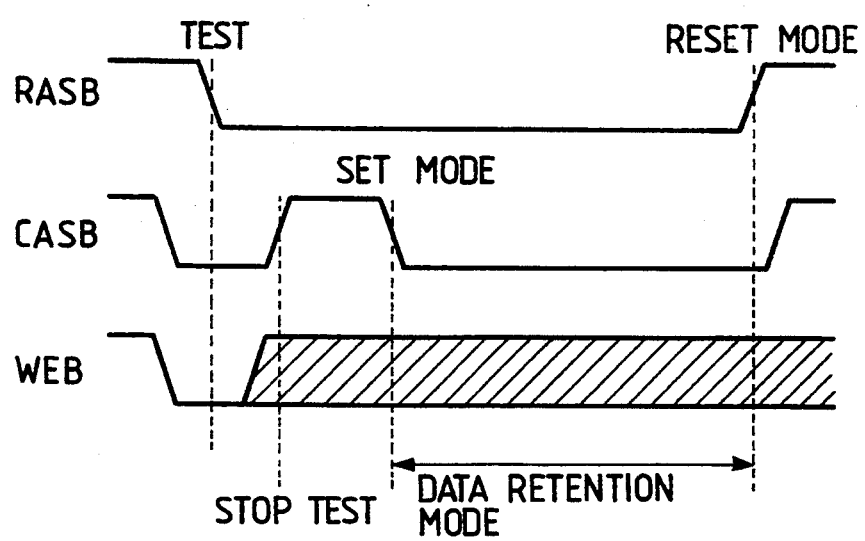
FIG. 3 is an operation timing chart showing another embodiment to set a data retention mode according to the invention.

FIG. 3 shows an operation timing chart of another embodiment to set the data retention mode. In this embodiment, seemingly the test mode is once entered. As the first mode, before the RASB signal, the WEB and CASB signals are set active low, then the WCBR mode is entered, and the CASB signal is reset high for directing test stop, then is set low for entering the data retention mode. Although not particularly limited, the mode is reset by resetting the RASB signal and CASB signal high. In this configuration, a dummy cycle is required to initialize the internal circuitry deactivated in the data retention mode. To reset the mode, CBR refresh as described above may be inserted as a dummy cycle. In this configuration, seemingly DRAM enters the test mode not frequently used in the system installation state and then enters the data retention mode according to controlling the subsequent CASB signal level, thus enabling extremely simple, steady, and secure setting and releasing of the data retention mode by combining the WEB signal with the RASB and CASB signals and also providing a simple internal circuit for the purpose. In the embodiment, the RAS only refresh function can also be left, maintaining complete compatibility with former DRAM.

Figure 4:
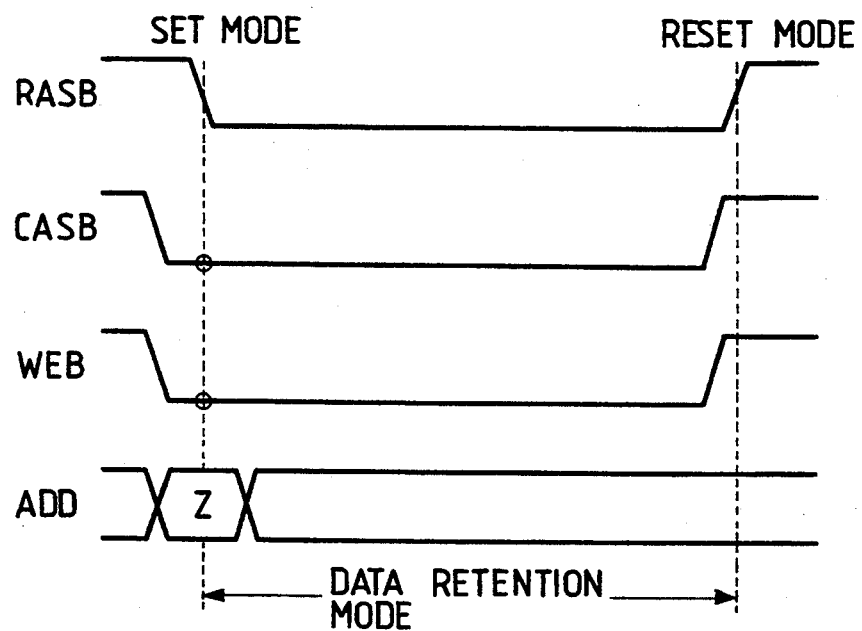
FIG. 4 is an operation timing chart showing a further embodiment to set a data retention mode according to the invention.

FIG. 4 shows an operation timing chart of a further embodiment to set the data retention mode.

In this embodiment, before the RASB signal, the WEB and CASB signals are set active low, then address signal ADD is read on the falling edge of the RASB signal, and the data retention mode is entered according to the address signal Z. This configuration also enables any other special mode than the data retention mode to be set by combining address signals.

Since circuits can be made fine with development of the semiconductor technologies, DRAM can be provided with an internal simple logical operation circuit for providing special modes such as a write mode with data processing in which a logical operation is performed on internal data and external data and the operation result is written, a write mode in which only specific bits of data consisting of a number of bits are rewritten from the external, and a search read mode in which if a specific bit of data consisting of a number of bits is the same as the specified bit, the bit data is read. When a number of such special modes can be used, one mode can be selected efficiently, steadily, and securely among the special modes by combining the address signals ADD.

Figure 5:
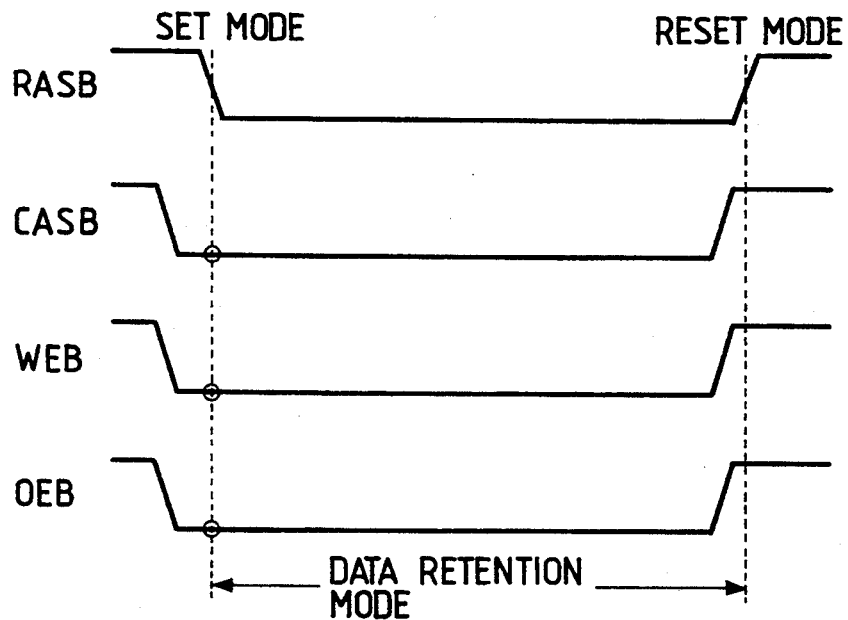
FIG. 5 is an operation timing chart showing another embodiment to set a data retention mode according to the invention.

FIG. 5 shows an operation timing chart of another embodiment to set the data retention mode.

In this embodiment, before the RASB signal, output enable signal OEB, if present, as well as the WEB and CASB signals is set active low, then whether or not these signals CASB, WEB, and OEB are low is judged on the falling edge of the RASB signal before the data retention mode is entered. This configuration enables simple, steady, and secure setting and releasing of the data retention mode by combining the WEB and OEB signals with the RASB and CASB signals and also provides a simple internal circuit for the purpose.

Figure 6:
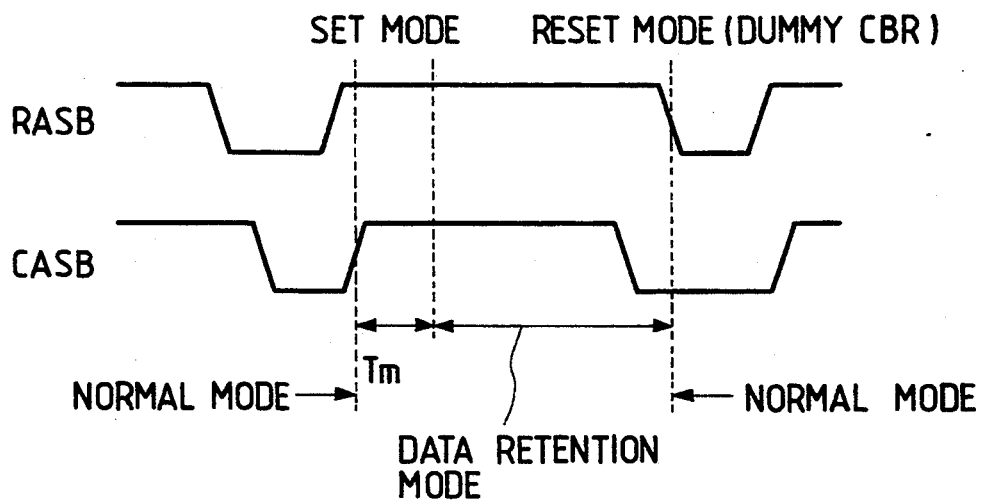
FIG. 6 is an operation timing chart showing another embodiment to set a data retention mode according to the invention.

FIG. 6 shows an operation timing chart of a further embodiment to set the data retention mode.

In this embodiment, when the normal mode terminates according to the RASB and CASB signals, immediately an internal timer circuit operates. This timer circuit measures the predetermined time Tm. Not shown in the timing chart, the timer is reset each time the normal mode, refresh mode, or test mode is executed within the time Tm, and the timer starts measurement operation when the standby state is entered.

Unlike the above-mentioned time 16 ms, the time Tm does not consider the information retention time in memory cells and is set to sufficiently short time considering the worst case because of variations in the information retention time in memory cells and the timer circuit setup time, temperature, and power supply fluctuation with respect to the information retention time in memory cells. If a memory access is not made within the setup time Tm, automatically the internal circuitry enters the data retention mode. To reset the data retention mode, dummy CBR refresh is executed.

Paying attention to the fact that in a comparatively small-scaled memory system, a memory access is frequently made in conjunction with data processing operation at a data processing device such as a microcomputer, the configuration assumes that the data processing device is in operation stop state when no memory access is made over the given time or longer, and automatically enters the data retention mode as described above. Thus, low power consumption is enabled without the need for extra operation control from the external. When the data processing devices starts operation, a memory access can be executed simply by inserting one dummy CBR refresh cycle.

Figure 7:
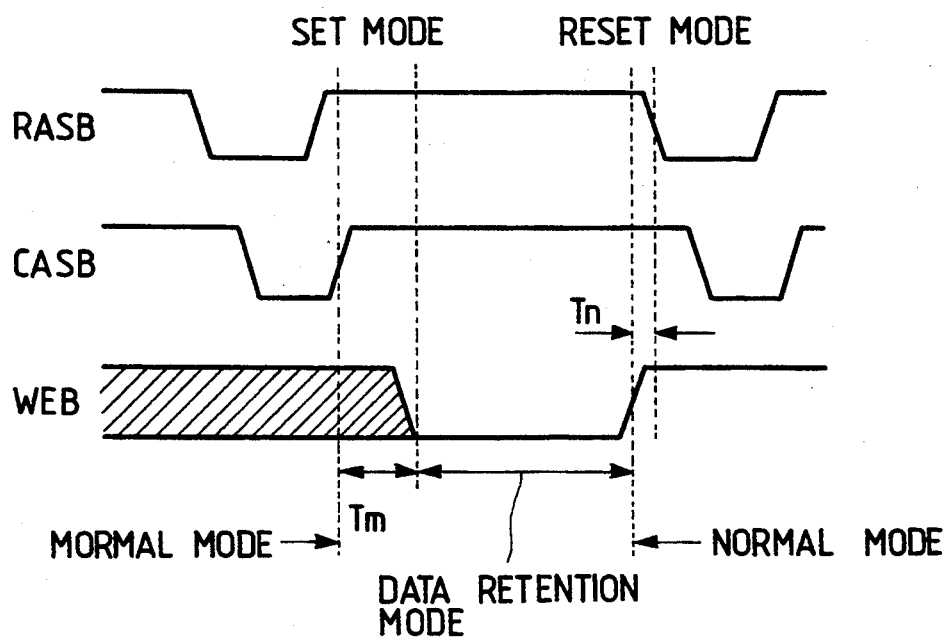
FIG. 7 is an operation timing chart showing a further embodiment to set a data retention mode according to the invention.

FIG. 7 shows an operation timing chart of another embodiment to set the data retention mode.

In the configuration as in the above-mentioned embodiment, when the normal mode terminates according to the RASB and CASB signals, immediately an internal timer circuit operates and when the timer times out, automatically the data retention mode is entered; however, the configuration may be applicable only to comparatively small-scaled memory systems. Then, the present embodiment uses the WEB signal to enable whether or not timer output is validated to be controlled. For example, when the WEB signal is set low within the above-mentioned time Tm, the timer time-out is validated and automatically the data retention mode is entered. If the WEB signal remains high, the time-out signal is invalidated and the normal standby state continues without entering the data retention mode. This configuration enables the data retention mode to be controlled more finely in accordance with a specific memory system by using the RASB and CASB signals and the WEB signal in combination.

The embodiment makes the low-to-high transition of the WEB signal to reset or release the data retention mode. After the mode is reset, immediately the internal circuitry enters the normal standby state and then immediately enters the normal operation mode. Setting the time Tn is required for the transition from the data retention mode to the standby state. That is, the WEB signal is reset high to reset the data retention mode, then in the time Tn, the normal mode can be entered. Instead of using the configuration, a dummy CBR refresh cycle as described above may be inserted to initialize the internal circuitry before the normal mode is entered.

Figure 8:
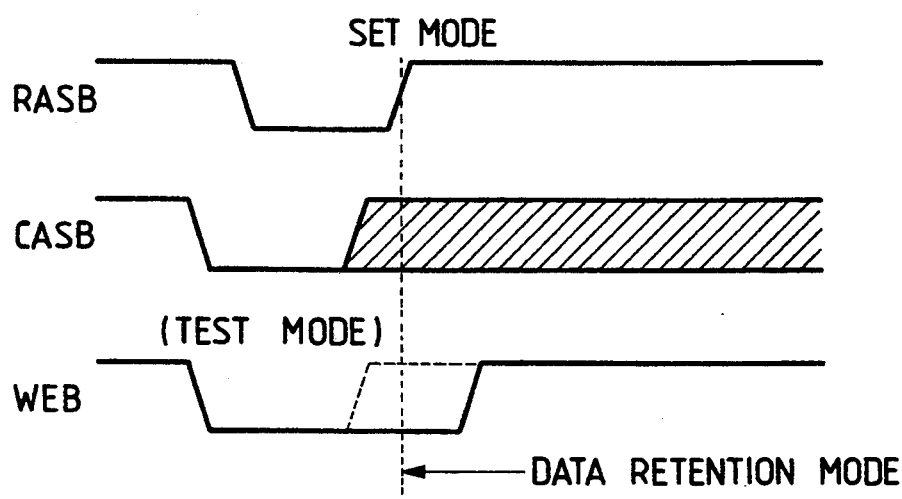
FIG. 8 is an operation timing chart showing another embodiment to set a data retention mode according to the invention.

FIG. 8 shows an operation timing chart of a further embodiment to set the data retention mode.

In this embodiment, the test mode is set artificially in a WCBR cycle as described above and the RASB signal is reset, at the timing of which the WEB signal is held low, thereby entering the data retention mode. In this example, the CASB signal may be high or low. If the WEB signal is high, the test mode is entered. To reset or release the data retention mode, although not shown, dummy CBR refresh is executed as described above or the CASB signal is held low and then reset high, at the timing of which the mode is reset and in the given time Tn as described above, the normal mode can be entered.

Figure 9:
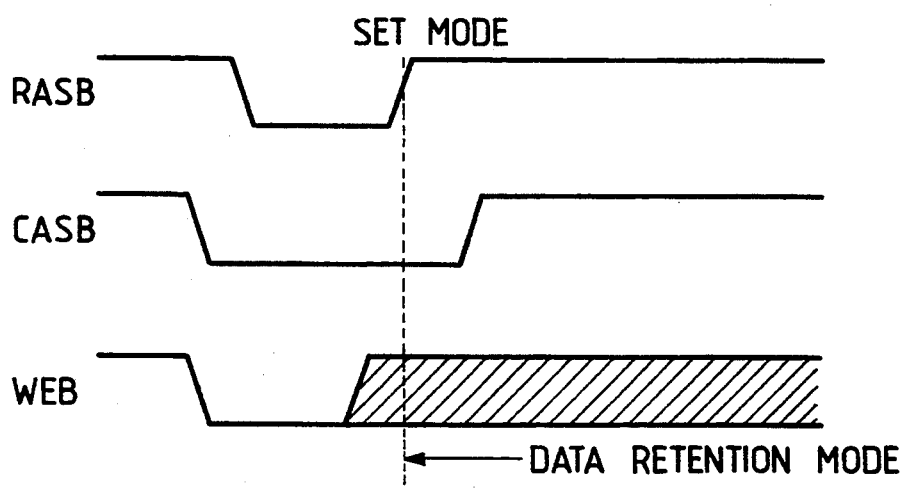
FIG. 9 is an operation timing chart showing a further embodiment to set a data retention mode according to the invention.

FIG. 9 shows an operation timing chart of another embodiment to set the data retention mode.

In this embodiment, a WCBR cycle as described above is executed and the RASB signal is reset, at the timing of which the WEB signal is held low, thereby entering the data retention mode. In this example, the WEB signal may be high or low. If the CASB signal is high, the test mode is entered. To reset or release the data retention mode, although not shown, dummy CBR refresh is executed as described above or the WEB signal is held low and then reset high, at the timing of which the mode is reset and in the given time Tn as described above, the normal mode can be entered.

Figure 10:
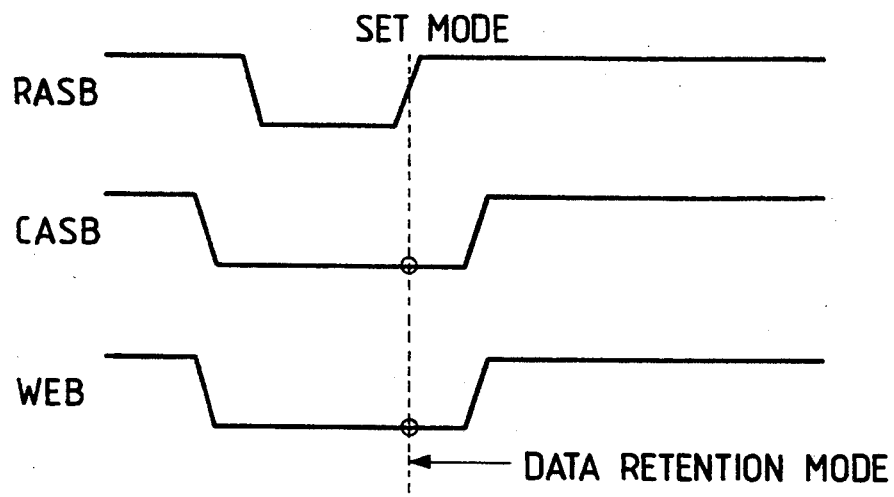
FIG. 10 is an operation timing chart showing another embodiment to set a data retention mode according to the invention.

FIG. 10 shows an operation timing chart of a further embodiment to set the data retention mode.

In this embodiment, a WCBR cycle as described above is executed and the RaSB signal is reset, at the timing of which both the CASB and WEB signals are held low, thereby entering the data retention mode. To reset or release the data retention mode, although not shown, dummy CBR refresh is executed as described above or the CASB or WEB signal is held low and then reset high, at the timing of which the mode is reset and in the given time Tn as described above, the normal mode can be entered.

Figure 11:
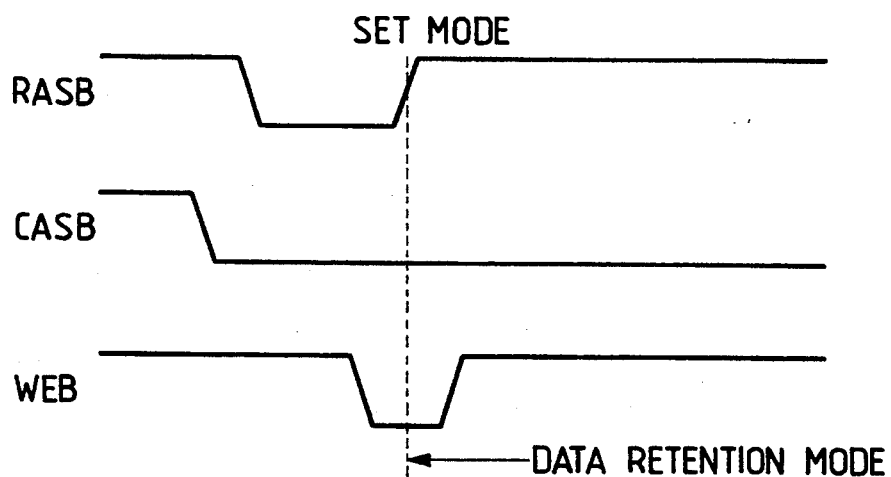
FIG. 11 is an operation timing chart showing a further embodiment to set a data retention mode according to the invention.

FIG. 11 shows an operation timing chart of another embodiment to set the data retention mode.

In this embodiment, a WCBR cycle as described above is executed and the RASB signal is reset, at the timing of which the WEB signal is held low, thereby entering the data retention mode. To reset or release the data retention mode, although not shown, dummy CBR refresh is executed as described above or the CASB signal is held low and then reset high, at the timing of which the mode is reset and in the given time Tn as described above, the normal mode can be entered.

Figure 25:
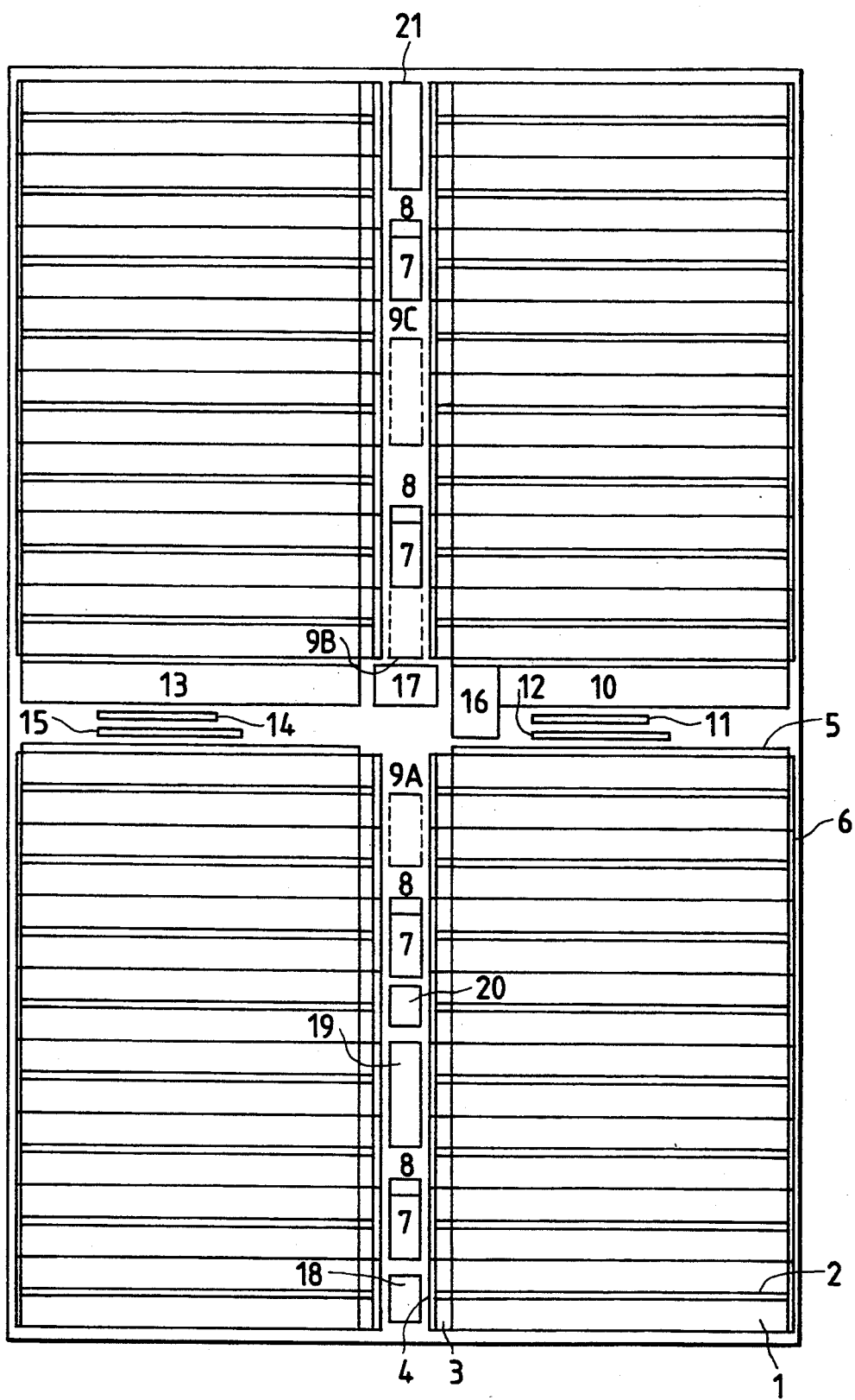
FIG. 25 is a block diagram showing one embodiment of dynamic RAM to which the invention is applied.

FIG. 25 shows a block diagram of one embodiment of dynamic RAM to which the invention is applied. The circuit blocks in the figure are formed on one semiconductor substrate such as a silicon single crystal by known production technologies of semiconductor integrated circuits. The circuit blocks in the figure are drawn in accordance with a geometrical layout on an actual semiconductor chip. In the description that follows, the term MOSFET used herein is employed to mean an insulated gate field effect transistor (IGFET).

As the chip size is made large with large capacity of memory, the wiring lengths of control signals, memory array drive signals, etc., are lengthened, thus slowing down the operation speed. To solve this problem, the layout of the memory array section making up RAM and the peripheral section for address selection, etc., in the embodiment is designed as follows:

In FIG. 25, a cross-shaped area is formed consisting of the longitudinal and horizontal central regions of the chip. The peripheral circuitry is mainly disposed in the cross-shaped area and a memory array is disposed in each of four areas into which the chip is divided by the cross-shaped area. Although not particularly limited, each of the four memory arrays is adapted to have a storage capacity of about 4M bits as described below. That is, the entire storage capacity of the four memory arrays is designed to be about 16M bits as a large storage capacity. For one memory mat 1, a word line is extended sidewise and a pair of complementary data lines or bit lines disposed in parallel are extended lengthwise. A pair of memory mats 1 are disposed left and right with a sense amplifier 2 as the center. The sense amplifier 2 is shared by the pair of left and right disposed memory mats 1 (shared sense amplifier system). A Y selection circuit 5 is located at the central region side of the chip for each of the four memory arrays. A Y selection line is extended on the memory mats of the corresponding memory array from the Y selection circuit 5 for switch control of MOSFET gate for column switch of each memory mat.

An X circuit 10 which consists of an X address buffer, an X redundant circuit, and an X address driver (logic stage), a RAS control signal circuit 11, a WE signal control circuit 12, and a reference voltage generation circuit 16 are located in the right portion of the horizontal central region of the chip. This reference voltage generation circuit 16, which is located near the center of the chip, receives external power supply VCC such as about 5 V and generates constant voltage VL corresponding to voltage such as about 3.3 V supplied to the internal circuitry. A Y circuit 13 which consists of a Y address buffer, a Y redundant circuit, and a Y address driver (logic stage), a CAS control signal circuit 14, and a test circuit 15 are located in the left portion of the horizontal central region of the chip. At the center of the chip is located an internal voltage decreasing circuit 17 which produces supply voltage VCL for peripheral circuits such as address buffers and decoders. If circuits such as the address buffer, the redundant circuit containing an address comparison circuit corresponding to the address buffer, and the CAS and RAS control signal circuits for control clock generation are disposed collectively at one place as described above, for example, the clock generation circuits and other circuits are distributed with a wiring channel between, in other words, the wiring channel is shared by the circuits, thereby enabling high integration and signals to be transmitted to the address driver (logical stage), etc., at the shortest equal distances.

The RAS control circuit 11 receives row address strobe signal RASB and activates the X address buffer. The address signal input to the X address buffer is supplied to the X redundant circuit where the address is compared with each stored defective address and whether or not a switch to the redundant circuit is to be made is judged. This result and the address signal are supplied to an X predecoder where a predecode signal is produced and supplied via the X address driver installed corresponding to each memory array to X decoder 3 installed corresponding to each memory mat as described above. On the other hand, the internal signals of RAS are supplied to the WE and CAS control circuits. For example, automatic refresh mode (CBR), test mode (WCBR), or special mode containing the data retention mode as described above is identified by judging the input order of the RASB, CASB, and WE signals. When the test mode is identified, the test circuit 15 is activated and a test function is set in accordance with a specific address signal suppled at the time.

The CAS control circuit 14 receives the CASB signal and produces various control signals of Y. The address signal input to the Y address buffer in synchronization with the high-to-low transition of the CASB signal is supplied to the Y redundant circuit where the address is compared with each stored defective address and whether or not a switch to the redundant circuit is to be made is judged. This result and the address signal are supplied to a Y predecoder where a predecode signal is produced and supplied via the Y address driver installed corresponding to each of the four memory arrays to Y decoder installed corresponding to each memory mat as described above. On the other hand, the CAS control circuit 14 receives RASB and WEB signals. If it judges test mode from the input order of the signals, the CAS control circuit activates the adjacent test circuit 15.

16 memory mats and eight sense amplifiers in total are located at the left and right symmetrically with respect to the central axis in the upper half of the chip. In the longitudinal central region of the chip, four main amplifiers 7 are located corresponding to left and right four blocks of memory mats and sense amplifiers. In addition, in the upper portion of the longitudinal central region are located an increased voltage generation circuit 21 which receives internal decreased voltage for word line selection, etc., and input pad areas 9B and 9C corresponding to input signals such as address signals and control signals. An internal voltage decreasing circuit 8 which produces operation voltage of sense amplifier 2 is located for each of the left and right four blocks described above. In the embodiment, eight memory mats 1 and four sense amplifiers 2 are located in one block and 16 memory mats 1 and eight sense amplifiers 2 in total are allocated left and right symmetrically with the longitudinal axis as the center. In the configuration, while a few number of main amplifiers 7 (four) are used, the amplified signal from each sense amplifier 2 can be transmitted to the main amplifier 7 via a short signal propagation route.

16 memory mats and eight sense amplifiers in total are also located at the left and right symmetrically with respect to the central axis in the lower half of the chip. In the longitudinal central region of the chip, four main amplifiers 7 are located corresponding to left and right four blocks of memory mats and sense amplifiers. In addition, in the lower portion of the longitudinal central region are located a reference voltage generation circuit 18 which receives internal decreased voltage and generates negative bias voltage to be supplied to the substrate, an input pad areas 9A corresponding to input signals such as address signals and control signals, a data output buffer circuit 19, and a data input buffer circuit 20. As in the upper portion, an internal voltage decreasing circuit 8 which produces operation voltage of sense amplifier 2 is located for each of the left and right four blocks described above. Thus, as in the upper portion, while a few number of main amplifiers 7 such as four are used, the amplified signal from each sense amplifier 2 can be transmitted to the main amplifier 7 via a short signal propagation route.

In addition to the input pad areas 9A-9C, various bonding pads (not shown) are located in the longitudinal central region. Pads for external power supply are provided as example of the bonding pads; a comparatively large number of pads (10 and several pads in total) are arranged in a substantially straight line for supplying circuit ground potential in order to enlarge an input level margin or to lower power supply impedance. These ground potential supply pads are connected to lengthwise extended ground potential leads which are formed using the known LOC technology. Some of the ground potential supply pads are provided mainly for lowering power supply impedance, such as those for preventing floating caused by coupling of unselected word lines of a word driver or word line clear and for common source of sense amplifier. Thus, for the circuit ground potential, the power supply impedance is lowered for internal circuit operation and ground wirings among internal circuits divided as described above are connected by a low-pass filter consisting of a LOC lead frame and bonding wire, thereby minimizing noise occurrence and propagation of circuit ground line noise among internal circuits.

The embodiment provides a pad corresponding to external power supply VCC such as about 5 V for each of the internal voltage decreasing circuits 8 and 17 which perform voltage conversion operation. As in the above, the pads are provided to lower the power supply impedance and minimize noise propagation of voltage among internal circuits (VCC, between VDL and VCC). Pads for address input, A0-A11, and pads for control signals such as RASB, CASB, WEB, and OEB are located in the input pad areas 9A-9C. In addition, data input and output pads as well as the following pads for bonding master, monitor, and monitor pad control are provided. As the pads for bonding master, there are those for specifying a static column mode and for specifying a nibble mode and the write mask function in the ×4 bit configuration. As the pads for monitor, there are those for monitoring pad internal voltages VCL, VDL, VL, VBB, VCH, and VPL. Of these internal voltages, VCL is peripheral circuit supply voltage of about 3.3 V and is produced by the internal voltage decreasing circuit 17 in common; VDL is supply voltage of about 3.3 V suppled to a memory array, that is, sense amplifier 2 and in the embodiment, four are provided corresponding to four memory blocks as described above; VCH is voltage stepped up to about 5.3 V upon reception of the internal voltage VDL, is word line selection level and boost supply voltage for selecting shared switch MOSFET; VBB is substrate back bias voltage such as −2 V; VPL is plate voltage of memory cell; and VL is constant voltage of about 3.3 V supplied to the internal voltage decreasing circuits 8 and 17.

Figure 12:
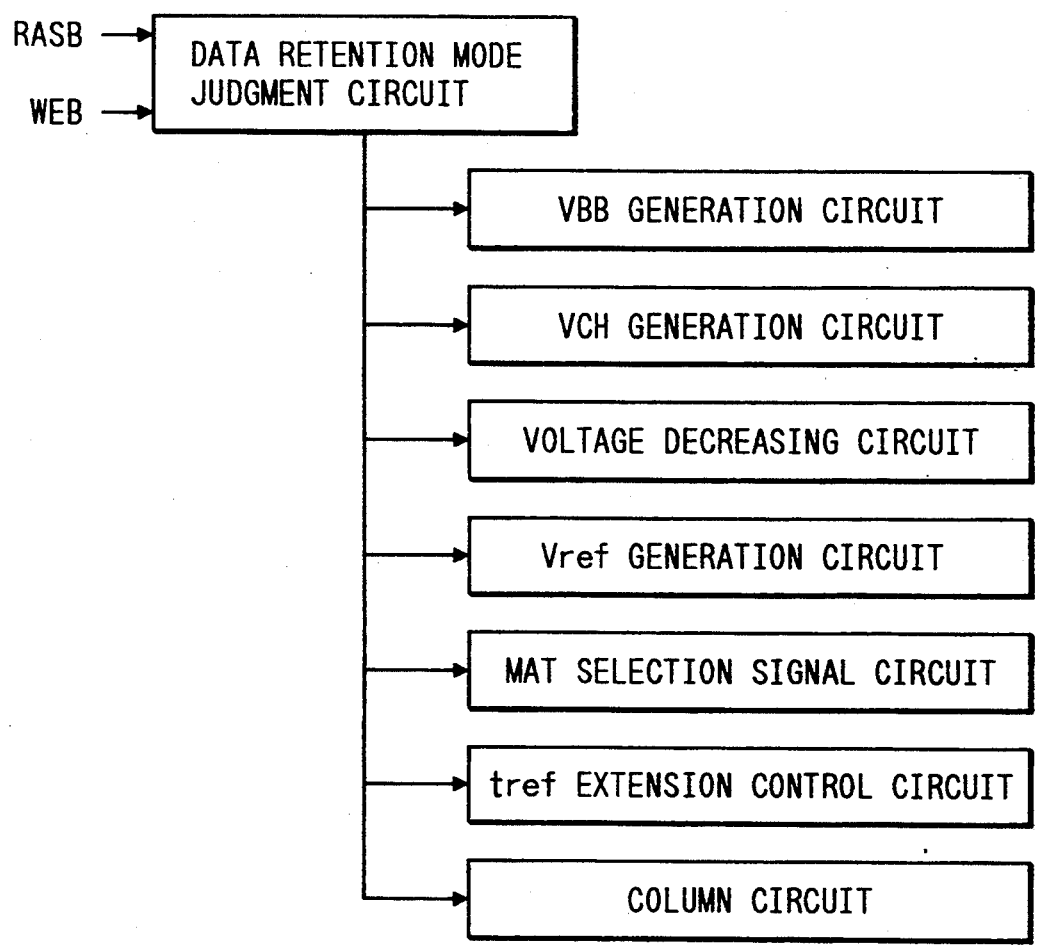
FIG. 12 is a block diagram showing one embodiment related to a data retention mode of dynamic RAM to which the invention is applied.

FIG. 12 shows a block diagram of one embodiment related to a data retention mode of DRAM as described above.

If a data retention mode judgment circuit receives, for example, RASB and WEB and judges the mode to be the data retention mode, the circuit causes the following circuits to switch to data retention mode operation: A VBB circuit which generates substrate back bias voltage; a VCH generation circuit which generates increased voltage for word boost; a voltage decreasing circuit which generates internal voltage such as about 3.3 V; a Vref circuit which supplies reference voltage to the voltage decreasing circuit; a mat selection signal generation circuit; a tref extension control circuit which prolongs a refresh period; and a column circuit.

Figure 13:
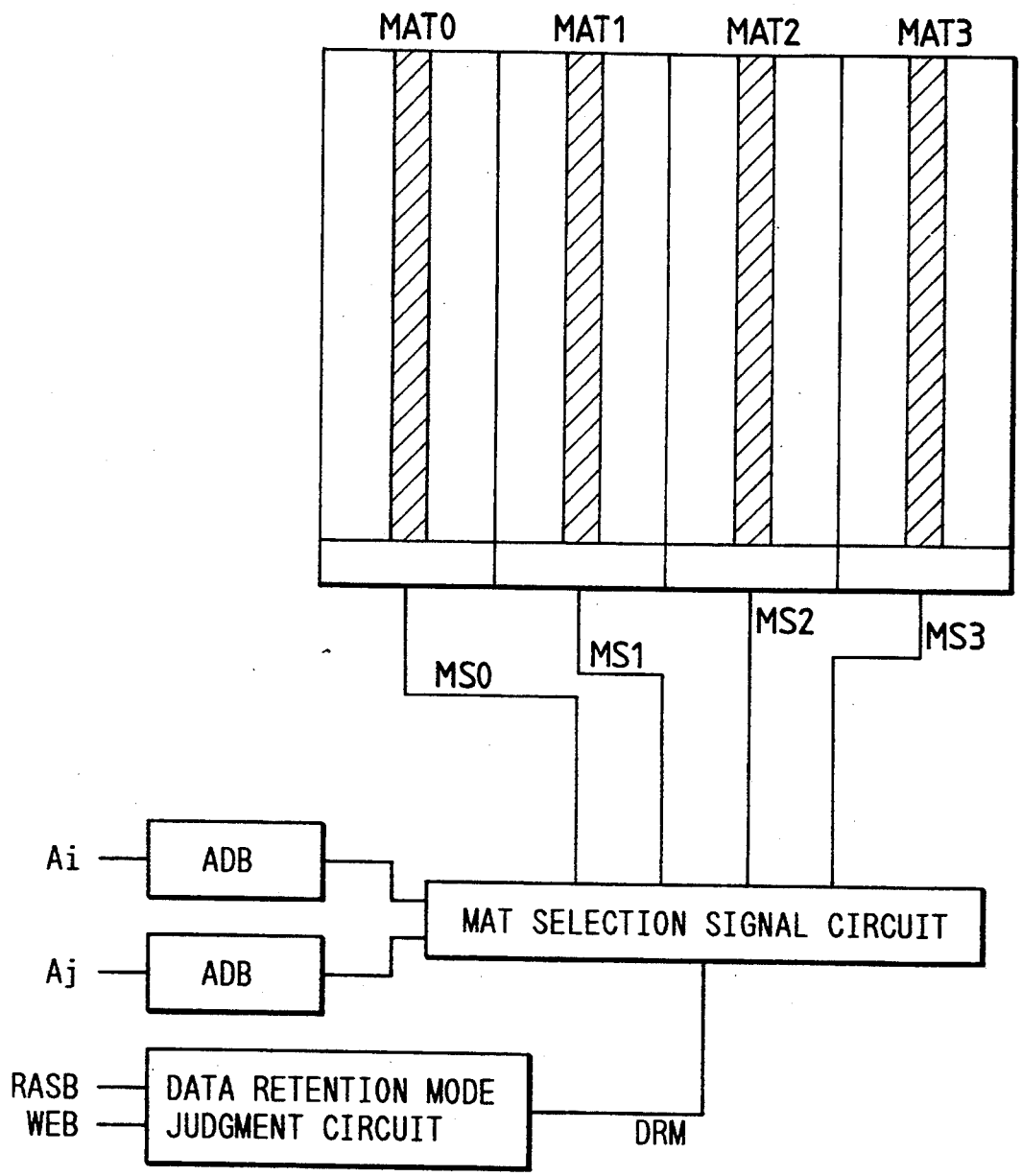
FIG. 13 is a block diagram illustrating a control example of one embodiment of a mat selection signal generation circuit of dynamic RAM to which the invention is applied.
Figure 14:
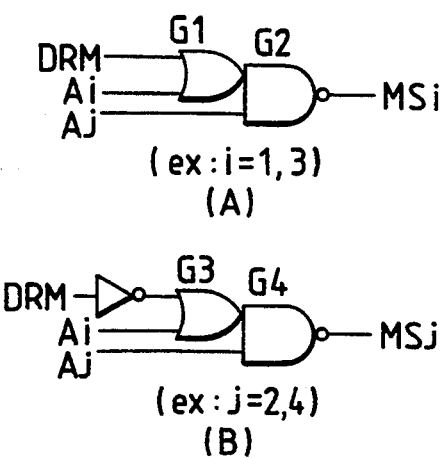
FIG. 14 is a logic diagram showing one embodiment of a mat selection signal generation circuit.

FIG. 13 shows a block diagram illustrating a control example of one embodiment of a mat selection signal generation circuit of dynamic RAM, wherein an example of four mats of MAT0-MAT3 is given for easy understanding of the invention. In the figure, a sense amplifier is located in the hatched portion at the center of each mat. FIGS. 14 (A) and (B) show a logic diagrams of one embodiment of a mat selection signal generation circuit.

During normal operation, only one of the four mats specified in the two bits of address signals Ai and Aj is activated. That is, as shown in FIG. 14 (A) and (B), a NAND gate circuit G2 or G4 generates a 1-mat selection signal MSi or MSj in response to a combination of the address signals Ai and Aj. Thus, consumption current can be concentrated on one mat, thereby enabling low power consumption and high speed operation of sense amplifiers. Such mat selection operation is also performed in refresh operation.

When judging the mode to be the data retention mode in response to a combination of the RASB and WEB signals, the data retention mode judgment generates a control signal DRM indicating the data retention mode. In the embodiment in FIG. 14 (A), the address signal Ai is invalidated by the control signal DRM. That is, the address signal Ai and control signal DRM are input via an OR gate circuit G1 to the NAND gate circuit G2. Therefore, when the control signal DRM is set to logical 1, the address signal Ai is invalidated and the two memory mats specified by the address signal Aj are selected simultaneously. In the embodiment in FIG. 14 (B), when the control signal DRM is set to logical 0, the inverter circuit inverts the control input of a NOR gate circuit G3 to logical 1 for invalidating the address signal Ai. Thus, the other address signal Aj is output through the NAND gate circuit G4, thereby simultaneously selecting the specified two memory mats.

This embodiment increases the number of memory mats refreshed in the data retention mode as compared with normal read/write and refresh operation, thereby decreasing the number of times the peripheral circuitry operates for refresh operation for low power consumption. Since operation need not be made fast in the data retention mode, operation current at the sense amplifiers is reduced as much as the number of memory mats increases as described above to limit an increase in the consumption current at the sense amplifiers. Thus, totally the consumption current at refresh operation in the data retention mode can be reduced drastically. In a disturbance test as described above, the test time can also be shortened in accordance with the number of memory mats operated simultaneously.

Figure 15:
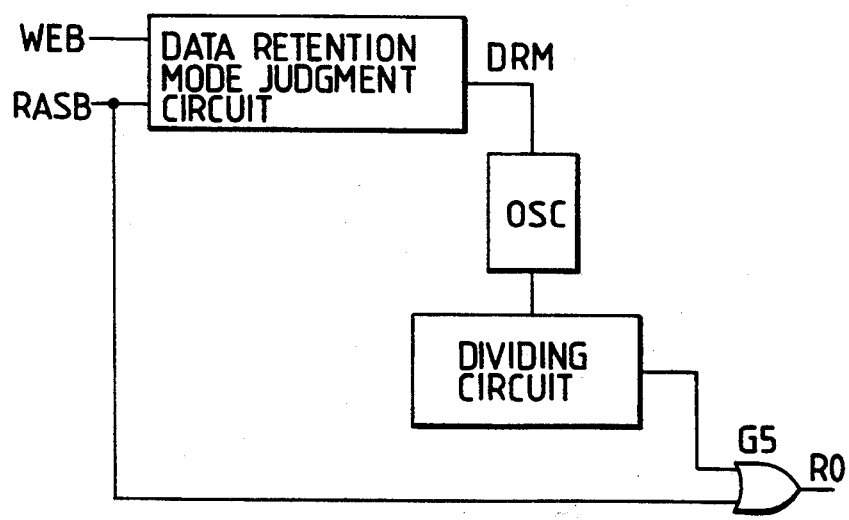
FIG. 15 is a block diagram showing one embodiment of a tref extension control circuit for prolonging a refresh period of dynamic RAM to which the invention is applied.

FIG. 15 shows a block diagram of one embodiment of a tref extension control circuit for prolonging a refresh period.

When judging the mode to be the data retention mode in response to a combination of the RASB and WEB signals, as in the above, the data retention mode judgment generates a control signal DRM indicating the data retention mode. An oscillation circuit OSC is activated by the control signal DRM. An oscillation signal of the oscillation circuit is divided by a dividing circuit and is output through an OR gate circuit G5 as a pulse R0 for determining a refresh period. That is, this R0 signal is input to a refresh address counter and a refresh address is updated in synchronization with the R0 signal. An RASB signal is input to the other input terminal of the OR gate circuit G5. Thus, in the normal CBR refresh mode, a refresh period is determined in synchronization with an RASB signal input from the external. Refresh operation consumption current in the data retention mode is reduced by prolonging a refresh period in such a manner.

Figure 16:
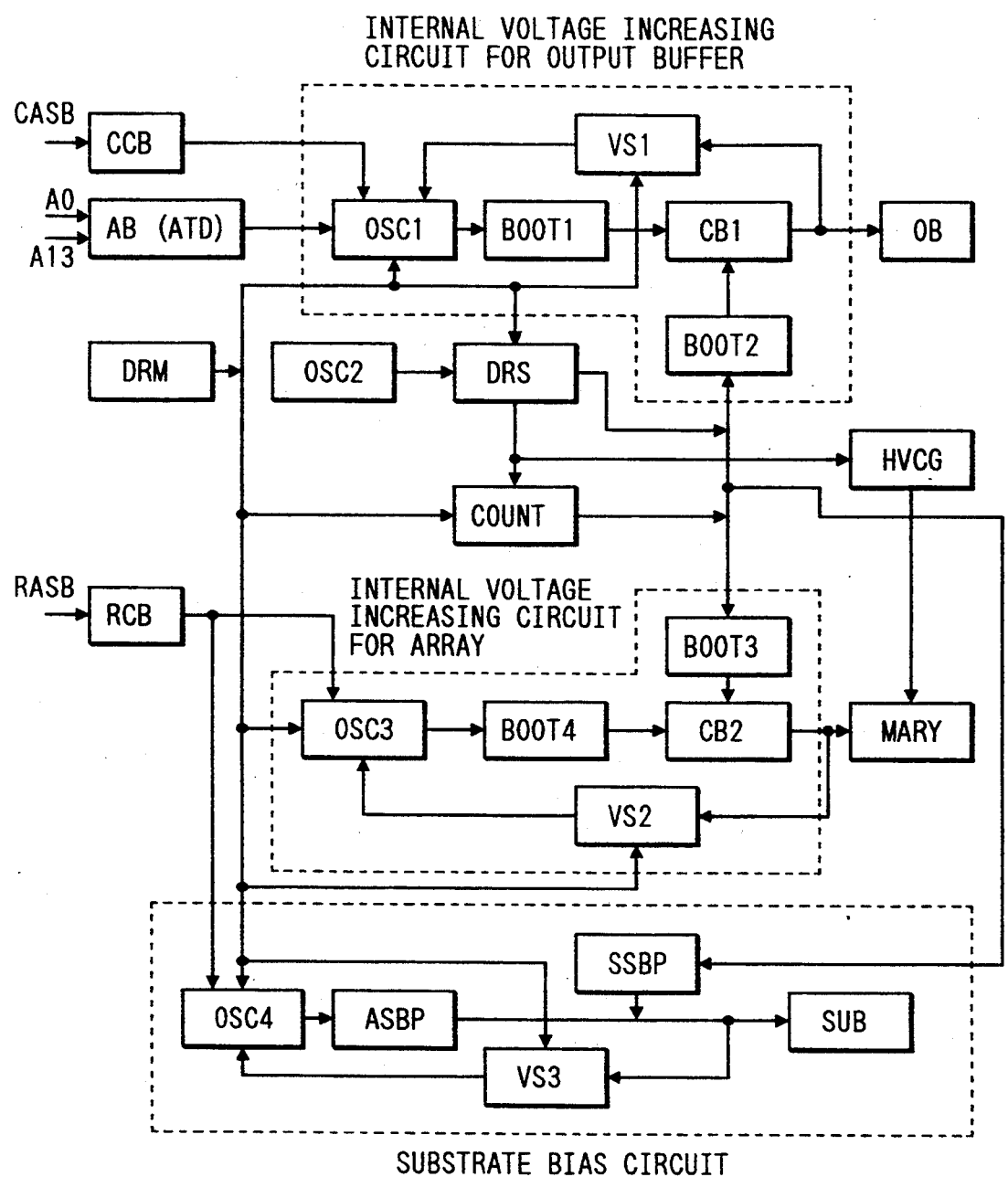
FIG. 16 is a block diagram showing one embodiment of other circuits whose operation is limited in data retention mode of dynamic RAM to which the invention is applied.

FIG. 16 shows a block diagram showing one embodiment of other circuits whose operation is limited in the data retention mode.

This embodiment shows an internal voltage increasing circuit for an output buffer for outputting a read signal formed by stepped-down internal voltage at high voltage corresponding to supply voltage, an internal voltage increasing circuit for a memory array for raising word line selection voltage, a substrate bias circuit, and a half precharge voltage generation circuit.

The internal voltage increasing circuit for output buffer consists of the following circuits: An oscillation circuit OSC1 is an active oscillation circuit whose oscillation operation is controlled upon reception of an output signal of an input buffer CCB which receives a CASB signal, an address change detection pulse contained in an address buffer AB, and an output signal of a voltage detection circuit VS1. A voltage increasing circuit BOOT1 generates increased voltage by using this oscillation output and bootstrap capacity CB1, and transmits it to an output buffer OB. A voltage detection circuit VS1 detects the increased voltage, and when the increased voltage reaches a desired voltage, the circuit VS1 stops operation of the oscillation circuit OSC1 to suppress useless current consumption. An oscillation circuit OSC2 performs steady operation for generating oscillation pulses which are supplied via a switch circuit DRS to a voltage increasing circuit BOOT2. When receiving the oscillation pulses, the voltage increasing circuit BOOT2 produces increased voltage steadily. The voltage increasing circuit BOOT2 has only a small current supply capability so as to compensate current consumed when the output buffer OB is inactive. In contrast, the above-mentioned voltage increasing circuit BOOT1 is adapted to have a large current supply capability so as to compensate large current consumed when the output buffer OB is activated. Consumption current in the internal voltage increasing circuit for output buffer can be minimized by combining these two voltage increasing circuits BOOT1 and BOOT2.

Paying attention to the fact that the output buffer OB is not activated in the data retention mode, the embodiment uses the control signal produced by the data retention mode judgment circuit DRM to stop operation of the oscillation circuit OSC1 and voltage detection circuit VS1. Operation of these circuits OSC1 and VS1 is stopped to prevent the circuits from being activated when refresh operation is performed in the data retention mode. In contrast, direct supply of the oscillation pulse generated by the oscillation circuit OSC2 to the voltage increasing circuit BOOT2 is shut off by the switch circuit DRS, and instead the oscillation pulse is input to a counter circuit COUNT where dividing is performed. Using such pulses whose period is prolonged by dividing, the voltage increasing circuit BOOT2 performs operation for maintaining increased output voltage, thereby intending low power consumption at the voltage increasing circuit. If the internal circuitry is thus deactivated, when a change is made to the normal mode, the first memory cycle becomes unstable. Then, dummy CBR refresh as described above is executed for activating the voltage increasing circuit BOOT1 which has a large current supply capability, thereby providing increased voltage required for stable operation of the output buffer OB.

The internal voltage increasing circuit for array consists of the following circuits: An oscillation circuit OSC3 is an active oscillation circuit whose oscillation operation is controlled upon reception of an output signal of an input buffer RCB which receives an RASB signal and an output signal of a voltage detection circuit VS2. A voltage increasing circuit BOOT4 generates increased voltage by using this oscillation output and bootstrap capacity CB2, and transmits it to a memory array MARY as word line selection voltage. A voltage detection circuit VS2 detects the increased voltage, and when the increased voltage reaches a desired voltage, the circuit VS2 stops operation of the oscillation circuit OSC3 to suppress useless current consumption. A voltage increasing circuit BOOT3 receives periodical pulses generated by the above-mentioned oscillation circuit OSC2 through the switch circuit DRS and produces increased voltage steadily. The voltage increasing circuit BOOT3 has only a small current supply capability so as to compensate steady level lower at the word line of the memory array MARY. In contrast, the above-mentioned voltage increasing circuit BOOT4 is adapted to have a large current supply capability so as to compensate large current consumed when the word line rises to the selection state. Consumption current in the internal voltage increasing circuit for array can be minimized by combining these two voltage increasing circuits BOOT3 and BOOT4.

The embodiment is intended to suppress current consumption at the voltage increasing circuit in the data retention mode as follows: The control signal produced by the data retention mode judgment circuit DRM is used to stop operation of the oscillation circuit OSC3 and voltage detection circuit VS2. Operation of these circuits OSC3 and VS2 is stopped to prevent the circuits from being activated when refresh operation is performed in the data retention mode. In contrast, as in the above, direct supply of the oscillation pulse generated by the oscillation circuit OSC2 to the voltage increasing circuit BOOT3 is shut off by the switch circuit DRS, and instead the oscillation pulse is input to a counter circuit COUNT where dividing is performed. Using such pulses whose period is prolonged by dividing, the voltage increasing circuit BOOT3 performs operation for maintaining increased output voltage, thereby intending low power consumption at the voltage increasing circuit. If the internal circuitry is thus deactivated, operation becomes unstable such that a sufficient selection level cannot be obtained in the first memory cycle when a change is made to the normal mode. Then, dummy CBR refresh as described above is executed for activating the voltage increasing circuit BOOT4 which has a large current supply capability, thereby providing increased voltage required for memory array word line selection operation.

The substrate bias circuit consists of the following circuits: An oscillation circuit OSC4 is an active oscillation circuit whose oscillation operation is controlled upon reception of an output signal of an input buffer RCB which receives an RASB signal and an output signal of a voltage detection circuit VS3. Upon reception of this oscillation output, a charge pump circuit ASBP generates negative substrate back bias voltage and transmits it to a substrate SUB. A voltage detection circuit VS3 detects the bias voltage, and when the bias voltage reaches a desired voltage, the circuit VS2 stops operation of the oscillation circuit OSC4 to suppress useless current consumption. A charge pump circuit SSBP receives pulses generated by the above-mentioned oscillation circuit OSC2 through the switch circuit DRS and produces bias voltage steadily. The charge pump circuit SSBP has only a small current supply capability so as to compensate leakage current generated steadily on the substrate. In contrast, the above-mentioned charge pump circuit ASBP is adapted to have a large current supply capability so as to compensate large current consumed when the internal circuitry operates. Consumption current in the substrate bias circuit can be minimized by combining these two charge pump circuits ASBP and SSBP.

The embodiment is intended to suppress current consumption at the substrate bias circuit in the data retention mode as follows: In the data retention mode, information storage operation in memory cells needs only to be secured and fluctuation in the back bias voltage on the substrate does not cause a substantial problem. Then, the control signal produced by the data retention mode judgment circuit DRM is used to stop operation of the oscillation circuit OSC4 and voltage detection circuit VS3. In contrast, as in the above, direct supply of the oscillation pulse generated by the oscillation circuit OSC2 to the pump charge circuit SSBP is shut off by the switch circuit DRS, and instead the oscillation pulse is input to a counter circuit COUNT where dividing is performed. Using such pulses whose period is prolonged by dividing, the charge pump circuit SSBP performs operation for maintaining substrate bias voltage, thereby intending low power consumption at the substrate bias circuit. If the internal circuitry is thus substantially deactivated, when a change is made to the normal mode, operation becomes unstable in the first memory cycle. Then, dummy CBR refresh as described above is executed for activating the charge pump circuit ASBP which has a large current supply capability, thereby providing required substrate bias voltage immediately.

The half precharge voltage generation circuit HVCG is provided to compensate the half precharge level of the data line placed in the non-selection state for lowering due to leakage current. The voltage generation circuit HVCG causes amplification MOSFET which receives reference voltage for low power consumption in the data retention mode to operate intermittently according to periodical pulses generated by the oscillation circuit. That is, in the data retention mode the voltage generation circuit HVCG is also refreshed in a long period as compared with normal operation, and in refresh operation the sense amplifiers perform comparatively slow amplification operation while being subjected to current limitation operation; according to this, amplification MOSFET operation is also performed intermittently.

Figure 17:
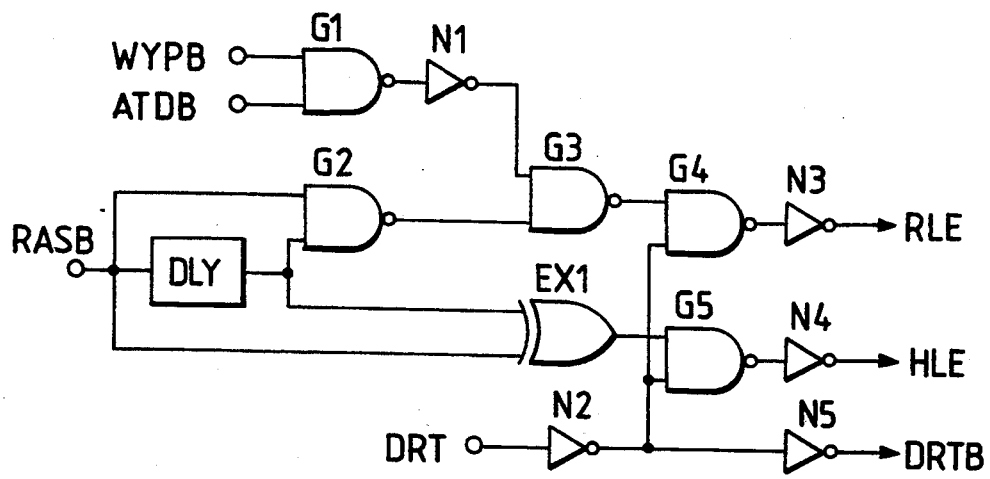
FIG. 17 is a circuit diagram showing one embodiment of a limiter control circuit contained in a data retention mode judgment circuit.

FIG. 17 shows a circuit diagram showing one embodiment of a limiter control circuit contained in a data retention mode judgment circuit. In the description to follow, some of the circuit symbols given to elements such as gate circuits and MOSFET are duplicate with those shown in other figures, but have different circuit functions for each figure.

Signals REL and HLE are generated in accordance with 1-shot pulse corresponding to the delay time of a delay circuit DLY by the delay circuit DLY and a NAND gate circuit G2 at a change in a write pulse WYPB or address signal change detection signal ATDB or RASB in the normal mode. Limiter output buffers are two circuits, one of which is operated during operation and the other of which is operated steadily for standby. The buffer operated during operation is activated intermittently by the signals RLE and HLE.

NAND gate circuits G4 and G5 controlled by a signal DRTB resulting from inverting a data retention mode control signal DRT by an inverter circuit N2 are added to such a limiter control circuit for forcing the signals RLE and HLE to be set low independently of the 1-shot pulse generated at a change in the signal WYPB, ATDB, or RASB. Even if refresh operation, etc., is performed in the data retention mode, limiter output buffer operation is forced to be stopped. The limiter output buffers are described later in detail.

Figure 18:
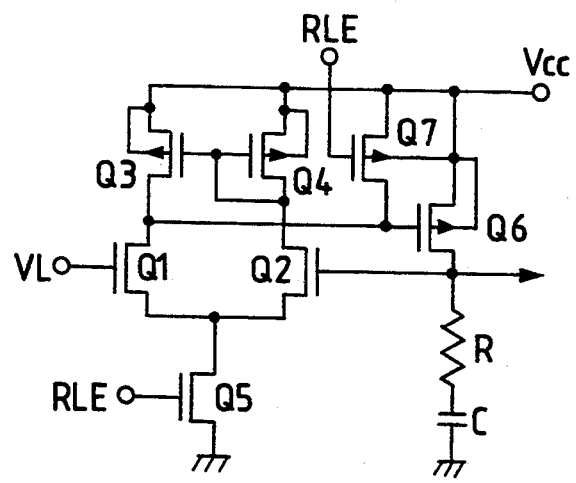
FIG. 18 is a circuit diagram showing one embodiment of a limiter output buffer for a memory array.

FIG. 18 shows a circuit diagram of one embodiment of a limiter output buffer for a memory array.

This limiter output buffer consists of an amplification circuit which receives reference voltage VL such as about 3.3 V generated by a limiter reference voltage generation circuit (described below) and power amplifies the voltage. The amplification circuit is made up of a differential circuit which consists of n-channel differential MOSFETs Q1 and Q2, p-channel load MOSFETs Q3 and Q4 located at the drain and formed like a current mirror, and an n-channel MOSFET Q5 making up an operation current source located at the common source of the differential MOSFETs Q1 and Q2, and a p-channel output MOSFET Q6 which receives an output signal of the differential circuit. Output of the amplification circuit is fed back to the gate of MOSFET Q2 which is inversion input to make up a voltage follower circuit and output an internal decreased voltage VCL corresponding to the reference voltage VL. A resistor R and a capacitor C make up a smoothing circuit for stabilization.

To operate the amplification circuit intermittently by a signal REL, signal RLE is supplied to the gate of MOSFET Q5 forming operation current. A p-channel switch MOSFET Q7 is located between the gate and source of the output MOSFET Q6 (supply voltage VCC) for supplying the control signal RLE. When the signal RLE is set low, the n-channel MOSFET Q5 is turned off, thereby stopping amplification operation of the differential circuit, in other words, current consumption. In response to the signal RLE which is set low, the p-channel MOSFET Q7 is turned on, turning off the output MOSFET Q6.

Figure 19:
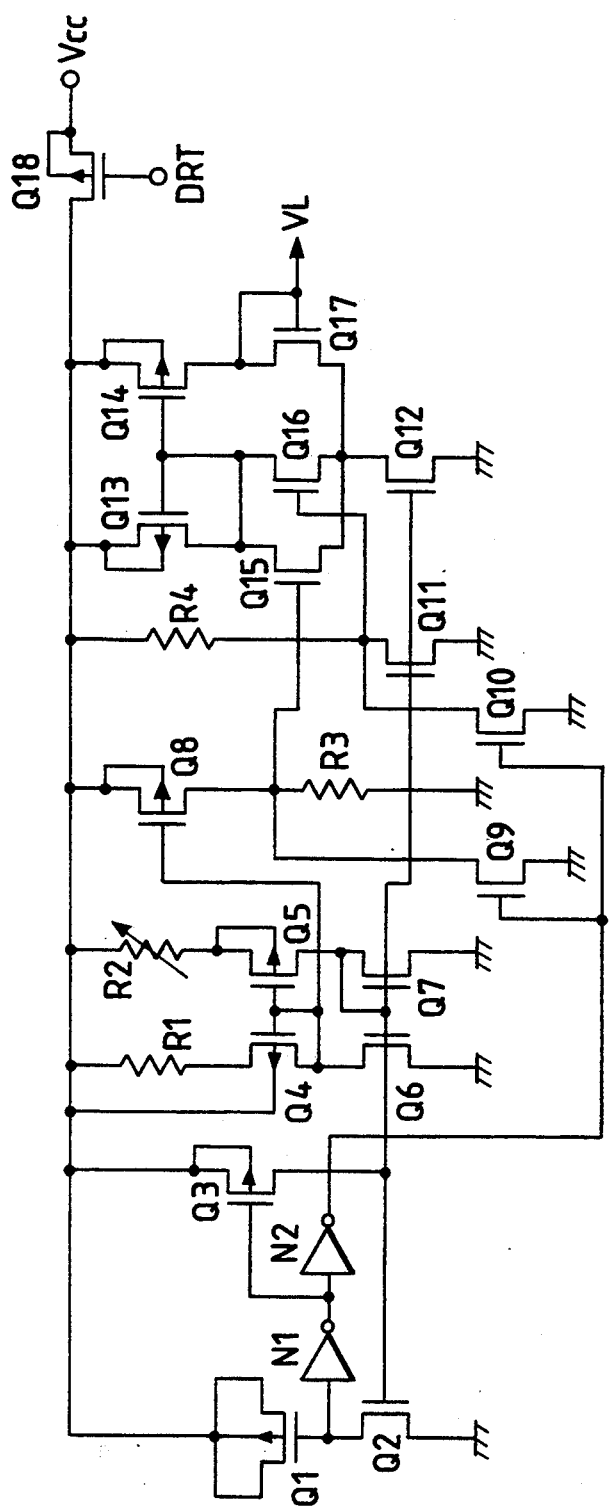
FIG. 19 is a circuit diagram showing one embodiment of a limiter reference voltage generation circuit.

FIG. 19 shows a circuit diagram of one embodiment of a limiter reference voltage generation circuit. This circuit is made up of a start circuit consisting of MOSFETs Q1–Q3 and inverter circuits N1 and N2, a constant current generation circuit consisting of MOSFETs Q4–Q7 and resistors R1 and R2, a VCC detection circuit consisting of MOSFETs Q8–Q11 and resistors R3 and R4, and a constant voltage generation circuit consisting of MOSFETs Q12–Q17. As operation of the internal voltage decreasing circuit (limiter circuit) is stopped as described above in the data retention mode, the embodiment also stops operation of the limiter reference voltage generation circuit. For this purpose, a power supply line to these circuits is provided with a power switch consisting of a p-channel MOSFET Q18 which is controlled by a control signal DRT. In other words, when the data retention mode is entered, the signal DRT which is set high turns off the p-channel MOSFET Q18, shutting off supply of operation voltage VCC to the limiter reference voltage generation circuit consisting of the above-mentioned circuits.

Figure 20:
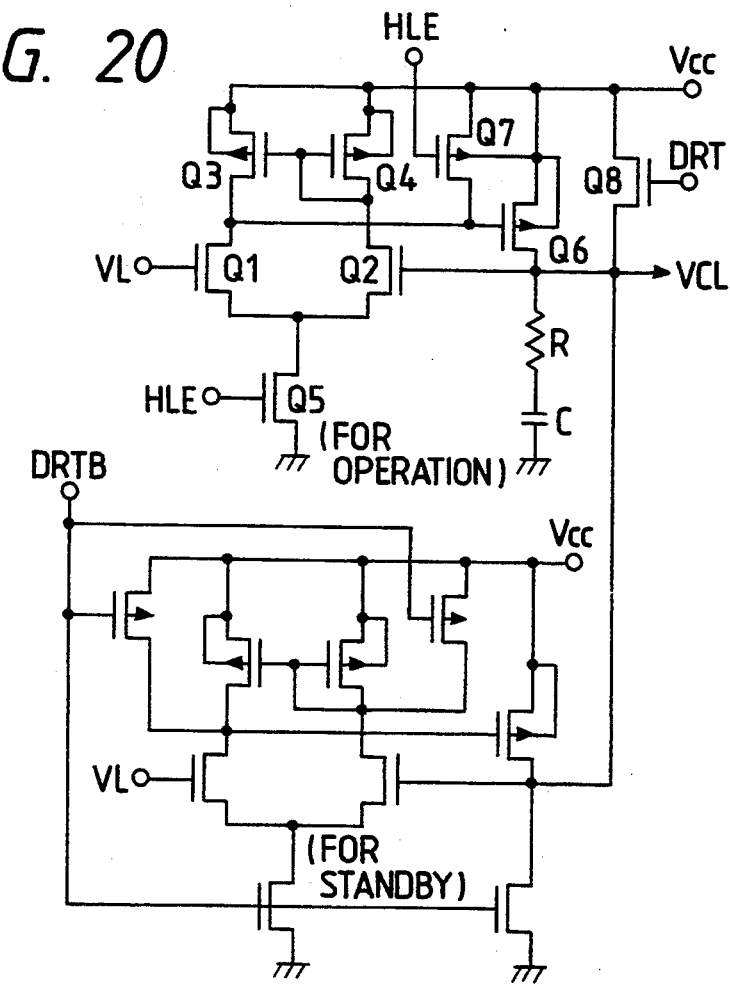
FIG. 20 is a circuit diagram showing one embodiment of a limiter output buffer for peripheral circuitry.

FIG. 20 shows a circuit diagram of one embodiment of a limiter output buffer for peripheral circuitry.

A limiter output buffer for operation is made up of similar circuits to those shown in FIG. 18 except that an n-channel switch MOSFET Q8 is added for sending operation voltage VCC to the internal circuitry intact to secure peripheral circuit operation voltage when operation of the limiter output buffer is stopped. When a control signal DRT generated in the data retention mode is set high, the switch MOSFET Q8 is turned on, sending the supply voltage VCC intact instead of the limiter output buffer. In fact, when the signal DRT is high like VCC, a voltage such as VCC-Vth is suppled as a peripheral circuit operation voltage wherein the Vth is a threshold voltage of the MOSFET Q8.

Operation of the limiter output buffer for peripheral circuitry is controlled by a signal HLE. In the data retention mode, the signal HLE is forced to be held low as described above, thus the limiter output buffer for operation is made not to operate during the data retention mode. A limiter output buffer for standby is also made up of a differential circuit and output MOSFETs as described above. To stop operation in the data retention mode, p-channel MOSFETs receiving a signal DRTB which is set low in the data retention mode are newly added to the limiter output buffer for standby. When these MOSFETs are turned on, output of the differential circuit is forced to be set high like the supply voltage VCC, thereby also stopping operation of the limiter output buffer for standby.

Figure 21:
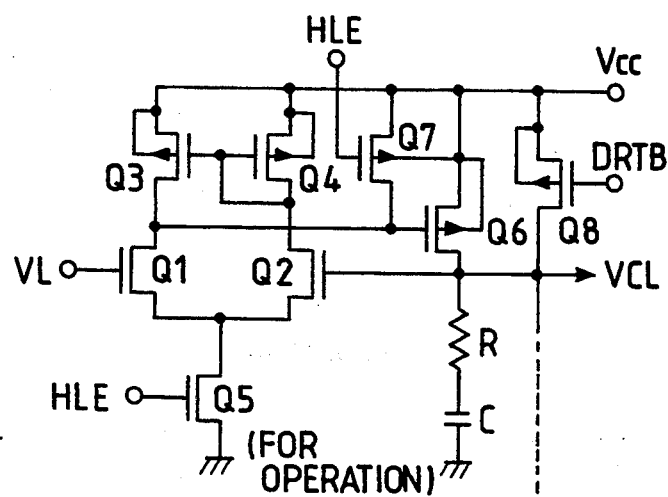
FIG. 21 is a circuit diagram showing another embodiment of a limiter output buffer for peripheral circuitry.

FIG. 21 shows a circuit diagram of another embodiment of a limiter output buffer for peripheral circuitry. This embodiment provides a limiter output buffer for operation with a p-channel switch MOSFET Q8 which is controlled by an inversion control signal DRTB. In the data retention mode, when the control signal DRTB is set low, the p-channel MOSFET Q8 is turned on, sending supply voltage VCC to the peripheral circuitry intact.

Figure 22:
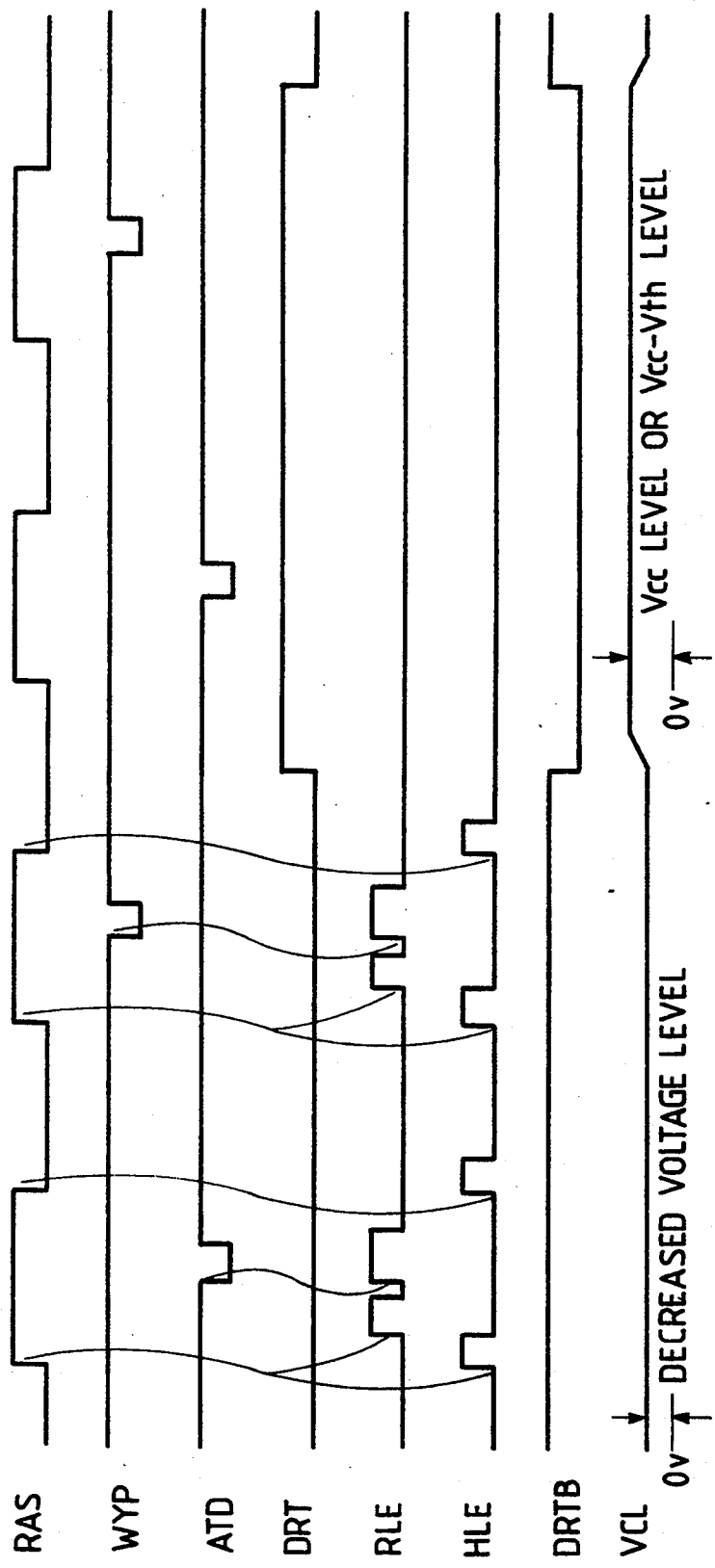
FIG. 22 is an operation timing chart showing one embodiment for illustrating a limiter control method.

FIG. 22 shows an operation timing chart of one embodiment for illustrating a limiter control method.

In the normal operation mode, a limiter output buffer for peripheral circuit operation is activated in synchronization with sense amplifier operation timing each time one pulse is generated when an RAS clock is set or reset, that is, falls low or rises high. It is also activated in synchronization with an ATD pulse corresponding to an address signal change to cover a high speed page mode and a WYP pulse for a write.

In contrast, when the data retention mode is entered, a reference voltage generation circuit and all limiter output buffers containing a limiter output buffer for peripheral circuit standby are stopped. Instead of stopping the limiter output buffers, external voltage VCC is supplied via an n-channel or p-channel MOSFET switch intact. In this case, since power supply impedance becomes very high as an internal voltage supply source, voltage becomes unstable to some degree, but voltage decreasing circuit consumption current becomes zero, thus it is suitable for the data retention mode. In the data retention mode, only refresh operation is performed in a long period generated in the chip inside, thus there is no chance that the access time will be adversely affected by fluctuation in internal voltage caused by the power supply impedance which is made high as described above.

Figure 23:
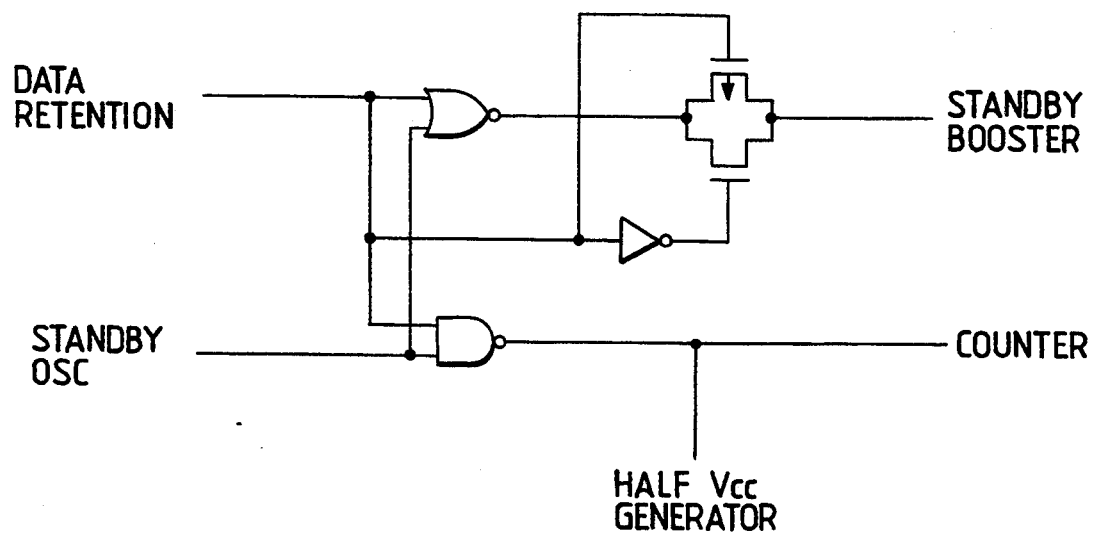
FIG. 23 is a circuit diagram showing one embodiment of the switch circuit DRS shown in FIG. 16.

FIG. 23 shows a circuit diagram of one embodiment of the switch circuit DRS shown in FIG. 16. Oscillation circuit output (Standby OSC) and control signal (Data Retention) are input to a NAND gate circuit. An output signal of the NAND gate circuit is supplied to a counter (Counter) and a half precharge voltage generation circuit (Half VCC Generator). The oscillation circuit output (Standby OSC) and control signal (Data Retention) are input to a NOR gate circuit. An output signal of the NOR gate circuit is supplied to a standby voltage increasing circuit (Standby Booster) through a CMOS switch circuit which is controlled by the control signal (Data Retention).

In the data retention mode, the control signal (Data Retention) is set high, thereby turning off the CMOS switch circuit and placing output in high impedance. Then, the NAND gate circuit enables the gate and sends oscillation pulses to the counter circuit and the half precharge circuit. In response to the pulses divided by the counter circuit, the standby voltage increasing circuit and charge pump circuit are operated and enters the low power consumption mode. In contrast, in the normal mode, in response to the control signal (Data Retention) which is set low, oscillation pulses are output through the NOR gate circuit and the CMOS switch circuit is turned on, feeding the oscillation pulses to the standby voltage increasing circuit, etc. At the time, output of the NAND gate circuit is held high, operation of the counter circuit is stopped, and an amplification circuit of the half precharge circuit is activated.

Figure 24:
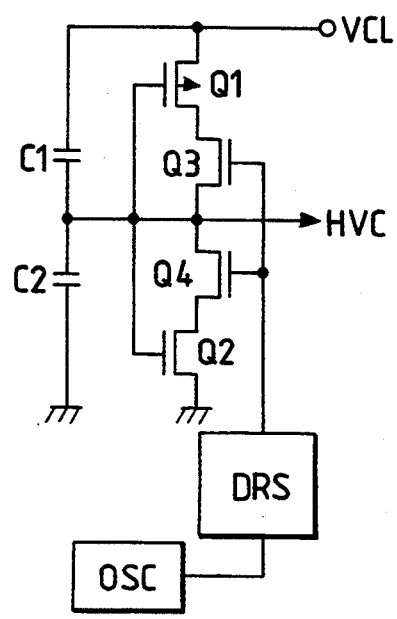
FIG. 24 is a circuit diagram showing one embodiment of the half precharge voltage generation circuit HVCG shown in FIG. 16.

FIG. 24 shows a circuit diagram of one embodiment of a half precharge voltage generation circuit HVCG.

This circuit generates a reference voltage like VCL/2 by a voltage dividing circuit consisting of capacitors C1 and C2, and supplies the voltage to an amplification circuit consisting of a p-channel MOSFET Q1 and an n-channel MOSFET Q2 for power amplification. This amplification circuit makes a negative feedback by commonly connecting input and output. In the data retention mode, switch MOSFET Q3 and Q4 are intermittently operated with oscillation pulses for reducing direct current.

In the data retention mode, the embodiment supplies oscillation pulses of an oscillation circuit OSC via a switch circuit DRS to the switch MOSFET Q3 and Q4 gate for intermittent operation of the amplification circuit. The switch circuit DRS is controlled by a control signal DRT. In the data retention mode, when the signal DRT is set high, oscillation pulses are supplied as described above; in the normal mode, high pulses are output.

The effects obtained from these embodiments are as follows:

(1) Data retention mode for low power consumption can be provided by limiting the current supply capabilities of the voltage generation circuits which generate decreased voltage, increased voltage, reference voltage, etc., in the range in which information retention operation in memory cells can be maintained.

(2) By performing refresh operation with the number of selected memory mats in the data retention mode increased with respect to that of memory mats selected in the normal read/write mode and refresh mode, the number of times the peripheral circuitry is operated for refresh operation can be reduced, thus the data retention mode for low power consumption can be provided.

(3) By adding the data retention mode in which operation of the internal circuits not adversely affecting data retention operation is stopped for low power consumption as a special mode provided for DRAM as in (1) and/or (2), applications of DRAM can be more enlarged such as nonvolatile memory with battery backup like static RAM and a data processing device driven with a battery.

(4) By performing a disturbance test with the number of selected memory mats in the data retention mode increased with respect to that of memory mats selected in the normal read/write mode and refresh mode, the test time can be shortened.

(5) By using dummy CBR refresh as a method of releasing the data retention mode and special mode like the disturbance test, the internal circuits can be initialized to the normal state without considering adverse affection such as destruction of stored data.

(6) By combining an address strobe signal and other control signals for setting a special mode, special modes containing a low power consumption mode which is efficient, secure, and stable can be set.

(7) By adding the data retention mode in which operation of the internal circuits not adversely affecting data retention operation is stopped for low power consumption as a special mode provided for DRAM, applications of DRAM can be more enlarged such as nonvolatile memory with battery backup like static RAM and a data processing device driven with a battery.

(8) By using dummy CBR refresh as a method of releasing the above-mentioned special mode, the internal circuits can be initialized to the normal state without considering adverse affection such as destruction of stored data.

Although the invention has been described in its preferred embodiments specifically, it is understood that the invention is not limited to the specific embodiments thereof and the combination and arrangement of parts may be changed without departing from the spirit and the scope of the invention. For example, deactivation of the internal circuits in the data retention mode can take various forms in accordance with the internal configuration of DRAM. More than one special mode may be provided in addition to the data retention mode. For the entire DRAM layout, in addition to the configuration as shown in FIG. 25, the memory mat configuration and peripheral circuit layout can take various forms.

The invention can be used for dynamic RAM in a wide range.

The effect obtained from a typical embodiment of the invention disclosed is simply described as follows: By combining an address strobe signal and other control signals for setting a special mode, special modes containing a low power consumption mode which is efficient, secure, and stable can be set and by using dummy CBR refresh as a method of releasing the special mode, the internal circuits can be initialized to the normal state without considering adverse affection such as destruction of stored data.

What is claimed is:

1. A dynamic RAM having a normal mode, a refresh mode and a data retention mode, said normal mode having a read operation period, a write operation period and a non-access period, said data retention mode having a refresh period and a non-refresh period, said dynamic RAM receiving at least one control signal in said refresh mode, said dynamic RAM comprising:

a voltage generation circuit for receiving a first voltage and generating a second voltage different from said first voltage; and said voltage generation circuit having a first supply capability for supplying said second voltage in said non-access period of said normal mode and having a second supply capability for supplying said second voltage in said non-refresh period of said data retention mode, wherein said second supply capability is lower than said first supply capability.

2. A dynamic RAM according to claim 1, wherein said voltage generation circuit is made up of a reference voltage generation circuit and a limiter output buffer which receives a reference voltage generated by said reference voltage generation circuit and performs power amplification and wherein operation of said reference voltage generation circuit and said limiter output buffer is stopped in the data retention mode.

3. A dynamic RAM according to claim 1, wherein a number of memory cells selected in said data retention mode is increased with respect to that of memory cells selected in said read or write operation periods of the normal mode and the refresh mode.

4. A dynamic RAM according to claim 1, further comprising operation and standby substrate voltage forming circuits wherein in said data retention mode, operation of said operation substrate voltage forming circuit is stopped and a period of an input pulse to said standby substrate voltage forming circuit is prolonged.

5. A dynamic RAM according to claim 4, further comprising operation and standby voltage increasing circuits which receive an operation voltage of an internal circuitry and generate an increased voltage raised more than the operation voltage wherein in said data retention mode, operation of said operation voltage increasing circuit is stopped and a period of an input pulse to said standby voltage increasing circuit is prolonged.

6. A dynamic RAM according to claim 5, wherein said operation voltage increasing circuit is made up of an oscillation circuit and a voltage increasing circuit which are operated when a memory access is made or when an increased voltage falls below a desired voltage.

7. A dynamic RAM according to claim 3, wherein a refresh period in said data retention mode is made longer than a refresh period in said refresh mode.

8. A dynamic RAM according to claim 1, wherein said refresh period and said non-refresh period are set alternately in said data retention mode.

9. A dynamic RAM according to claim 8 further comprising a refresh address generating means including an oscillation means for outputting pulses having a predetermined frequency, for controlling refresh of a plurality of memory cells based on said pulses outputted from said oscillation means in said data retention mode.

10. A dynamic RAM according to claim 9, wherein said refresh address generating means comprises:
   a refresh address counter for incrementing refresh addresses of said plurality of memory cells in accordance with said pulses outputted from said oscillation means.

11. A dynamic RAM according to claim 10, wherein said oscillation means comprises:
   a dividing circuit for dividing a frequency for received signals.

12. A dynamic RAM according to claim 1, wherein said voltage generation circuit consumes a first power for supplying said second voltage in said non-access period of said normal mode, and consumes a second power smaller than said first power for supply said second voltage in said non-refresh period of said data retention mode.

13. A dynamic RAM according to claim 1, wherein said voltage generation circuit has said second supply capability in said refresh period of said data retention mode.

14. A dynamic RAM according to claim 1, wherein said refresh mode comprises a RAS only refresh mode, wherein said at least one control signal is a row address strobe signal, wherein in said RAS only refresh mode, refresh addresses are inputted from outside of said dynamic RAM.

15. A dynamic RAM according to claim 1, wherein said refresh mode comprises a CBR refresh mode, wherein in said CBR refresh mode, refresh addresses are generated in said dynamic RAM.

16. A dynamic RAM according to claim 1, wherein each of a plurality of memory cells indicated in said dynamic RAM comprises a MOS transistor and a capacitor coupled to the source-drain path of said MOS transistor.

17. A dynamic RAM according to claim 1, wherein said voltage generation circuit comprises:
   at least one of a Vbb generation circuit for generating a substrate back bias voltage;
   a Vch generation circuit for generating a increased voltage for word lines which are coupled to a plurality of memory cells; and
   a voltage decreasing circuit for generating a decreased voltage lower than a supply voltage supplied from an outside of said dynamic RAM.

18. A dynamic RAM according to claim 1, wherein said voltage generation circuit comprises:
   oscillating means for forming pulse signals having one of a first frequency and a second frequency lower than said first frequency, wherein said voltage generation circuit generates said second voltage based on said pulse signals having said first frequency in said non-access period of said normal mode, and wherein said voltage generation circuit generates said second voltage based on said pulse signals having said second frequency in said non-refresh period of said data retention mode.

19. A dynamic RAM according to claim 18, wherein said oscillating means further forms pulse signals having a third frequency higher than said first frequency, wherein said voltage generation circuit generates said second voltage based on said pulse signals having said third frequency in said read operation period and said write operation period of said normal mode.

20. A dynamic RAM according to claim 19, wherein said voltage generation circuit generates said second voltage based on said pulse signals having said second frequency in said refresh period of said data retention mode.

21. A dynamic RAM according to claim 18, wherein said refresh period and said non-refresh period are set alternately in said data retention mode.

22. A dynamic RAM according to claim 21 further comprising:
   refresh address generating means including an oscillation means for outputting pulses having a predetermined frequency, for controlling refresh of a plurality of memory cells based on said pulses outputted from said oscillation means in said data retention mode.

23. A dynamic RAM according to claim 22, wherein said refresh address generating means comprises:
   a refresh address counter for incrementing refresh addresses of said plurality of memory cells in accordance with said pulses outputted from said oscillation means.

24. A dynamic RAM according to claim 23, wherein said oscillation means comprises:
   a dividing circuit for dividing a frequency of received signals.

25. A dynamic RAM according to claim 18, wherein said refresh mode comprises a RAS only refresh mode, wherein said dynamic RAM receives a row address strobe signal and refresh addresses in said RAS only refresh mode.

26. A dynamic RAM according to claim 18, wherein said refresh mode comprises a CBR refresh mode, wherein in said CBR refresh mode, refresh addresses are generated in said dynamic RAM.

27. A dynamic RAM according to claim 18, wherein each of said plurality of memory cells included in said dynamic RAM comprises a MOS transistor and a capacitor coupled to the source-drain path of said MOS transistor.

28. A dynamic RAM according to claim 18, wherein said voltage generation circuit comprises:
   at least one of a Vbb generation circuit for generating a substrate back bias voltage;
   a Vch generation circuit for generating a increased voltage for word lines which are coupled to a plurality of memory cells; and
   a voltage decreasing circuit for generating a decreased voltage lower than a supply voltage supplied from an outside of said dynamic RAM.

29. A dynamic RAM having a normal mode, a refresh mode and a data retention mode, said normal mode having a read operation period, a write operation period and a non-access period, said data retention mode having a refresh period and a non-refresh period, said dynamic RAM receiving at least one control signal in said refresh mode, said dynamic RAM comprising:
   a plurality of memory cells for storing data; and
   a voltage generation circuit, coupled to receive a first voltage, for generating a second voltage different from said first voltage,
   wherein said data of said plurality of memory cells are refreshed when said dynamic RAM is in said refresh mode and said refresh period of said data retention mode, and
   wherein said voltage generation circuit comprises:
   a first supply capability for supplying said second voltage in said read and write operation periods in said normal mode,
   a second supply capability for supplying said second voltage lower than said first supply capability in said non-access period in said normal mode, and
   a third supply capability for supplying said second voltage smaller than said second supply capability in said non-refresh period in said data retention mode.

30. A dynamic RAM according to claim 29, wherein said voltage generation circuit has said third supply capability in said refresh period of said data retention mode.

31. A dynamic RAM according to claim 29, wherein said voltage generation circuit has said first supply capability for supplying said second voltage in said refresh mode.

32. A dynamic RAM according to claim 29, wherein said refresh period and said non-refresh period are automatically set alternately in said data retention mode.

33. A dynamic RAM according to claim 32 further comprising:
   a refresh address generation means including an oscillation means for outputting pulses having a predetermined frequency, for controlling refresh of said plurality of memory cells based on said pulses outputted from said oscillating means in said data retention mode.

34. A dynamic RAM according to claim 33, wherein said refresh address generating means comprises:
   a refresh address counter for incrementing refresh addresses of said plurality of memory cells in accordance with said pulses outputted from said oscillating means.

35. A dynamic RAM according to claim 34, wherein said oscillating means comprises:
   a dividing circuit for dividing a frequency of received signals.

36. A dynamic RAM according to claim 29, wherein said refresh mode comprises a RAS only refresh mode, wherein said at least one control signals is a row address strobe signal, wherein said RAS only refresh mode, refresh addresses are inputted from an outside of said dynamic RAM.

37. A dynamic RAM according to claim 29, wherein said refresh mode comprises a CBR refresh mode, wherein in said CBR refresh mode, refresh addresses are generated in said dynamic RAM.

38. A dynamic RAM according to claim 29, wherein each of said plurality of memory cells comprises a MOS transistor and a capacitor coupled to the source-drain path of said MOS transistor 39. A dynamic RAM according to claim 29, wherein said voltage generation circuit comprises:
   at least one of a Vbb generation circuit for generating a substrate back bias voltage;
   a Vch generation circuit for generating an increased voltage for word lines which are coupled to said plurality of memory cells; and
   a voltage decreasing circuit for generating a decreased voltage lower than a supply voltage supplied from outside of said dynamic RAM.

40.. A dynamic RAM having a normal node, a refresh mode and a data retention mode, said normal mode having a read operation period, a write operation period and a non-access period, said data retention mode having a refresh period and a non-refresh period, said dynamic RAM receiving at least one control signal in said refresh mode, said dynamic RAM comprising:
   a voltage generation circuit, coupled to receive a first voltage, for outputting a second voltage different from said first voltage, wherein said voltage generation circuit comprises:
   an oscillating means for forming pulse signals having one of a first frequency and a second frequency lower than said first frequency,
   wherein said voltage generation circuit generates said second voltage based on said pulse signals having said first frequency in said non-access period of said normal mode, and
   wherein said voltage generation circuit generates said second voltage based on said pulse signals having said second frequency in said non-refresh period of said data retention mode.

41. A dynamic RAM according to claim 40, wherein said oscillating means further forms pulse signals having a third frequency higher than said first frequency, wherein said voltage generation circuit generates said second voltage based on said pulse signals having said third frequency in said read operation period and said write operation period of said normal mode.

42. A dynamic RAM according to claim 41, wherein said voltage generation circuit generates said second voltage based on said pulse signals having said second frequency in said refresh period of said data retention mode.

43. A dynamic RAM according to claim 40, wherein said refresh period and said non-refresh period are set alternately in said data retention mode.

44. A dynamic RAM according to claim 43 further comprising:
   refresh address generating means including an oscillation means for outputting pulses having a predetermined frequency, for controlling refresh of a plurality of memory cells based on said pulses outputted from said oscillation means in said data retention mode.

45. A dynamic RAM according to claim 44, wherein said refresh address generating means comprises:
   a refresh address counter for incrementing refresh addresses of said plurality of memory cells in accordance with said pulses outputted from said oscillation means.

46. A dynamic RAM according to claim 45, wherein said oscillation means comprises:
   a dividing circuit for dividing a frequency of received signals.

47. A dynamic RAM according to claim 40, wherein said refresh mode comprises a RAS only refresh mode, wherein said dynamic RAM receives a row address strobe signal and refresh addresses in said RAS only refresh mode.

48. A dynamic RAM according to claim 40, wherein said refresh mode comprises a CBR refresh mode, wherein in said CBR refresh mode, refresh addresses are generated in said dynamic RAM.

49. A dynamic RAM according to claim 40, wherein each of said plurality of memory cells included in said dynamic RAM comprises a MOS transistor and a capacitor coupled to the source-drain path of said MOS transistor.

50. A dynamic RAM according to claim 40, wherein said voltage generation circuit further comprises:
- at least one of a Vbb generation circuit for generating a substrate back bias voltage;
- a Vch generation circuit for generating an increased voltage for word lines which are coupled to a plurality of memory cells; and
- a voltage decreasing circuit for generating a decreased voltage lower than a supply voltage supplied from an outside of said dynamic RAM.

* * * * *